(12) United States Patent
Shizuno

(10) Patent No.: US 7,087,514 B2
(45) Date of Patent: Aug. 8, 2006

(54) SUBSTRATE HAVING BUILT-IN SEMICONDUCTOR APPARATUS AND MANUFACTURING METHOD THEREOF

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/218,534

(22) Filed: Sep. 6, 2005

(65) Prior Publication Data

US 2006/0008944 A1    Jan. 12, 2006

Related U.S. Application Data

(62) Division of application No. 10/742,940, filed on Dec. 23, 2003.

(30) Foreign Application Priority Data

Sep. 26, 2003   (JP) .............................. 2003/336380

(51) Int. Cl.
*H01L 21/44* (2006.01)
(52) U.S. Cl. ...................... 438/617; 438/311; 438/584; 438/589
(58) Field of Classification Search ................ 438/311, 438/584, 589, 647, 648, 684, 685
See application file for complete search history.

(56) References Cited

U.S. PATENT DOCUMENTS 6,750,125 B1 *  6/2004  Ohuchi ....................... 438/584

FOREIGN PATENT DOCUMENTS

JP            2002-170827           6/2002

* cited by examiner

*Primary Examiner*—Mai-Huong Tran
(74) *Attorney, Agent, or Firm*—Wenderoth, Lind & Ponack, L.L.P.

(57) ABSTRACT

A substrate having a built-in semiconductor apparatus includes: a semiconductor apparatus which comprises a first semiconductor chip having a first electrode pad formed on a main surface thereof, a protruding portion which is in contact with the first semiconductor chip and protrudes from a side surface of the first semiconductor chip to the outside, an apparatus wiring portion which is provided so as to extend from the first electrode pad onto a surface of the protruding portion, a conductive portion which is in connected with the apparatus wiring portion and provided on the apparatus wiring portion, and a sealing layer which covers the main surface and the surface of the protruding portion so as to expose a top face of the conductive portion; an insulating layer in which the semiconductor apparatus is embedded; an external terminal provided on the insulating layer; and a substrate wiring portion which electrically connects the conductive portion with the external terminal.

10 Claims, 25 Drawing Sheets

SUBSTRATE HAVING BUILT-IN SEMICONDUCTOR APPARATUS ACCORDING TO FIRST EMBODIMENT OF THIS INVENTION

SUBSTRATE HAVING BUILT-IN SEMICONDUCTOR APPARATUS ACCORDING TO FIRST EMBODIMENT OF THIS INVENTION

MANUFACTURING STEPS OF SUBSTRATE HAVING BUILT-IN
SEMICONDUCTOR APPARATUS ACCORDING TO FIRST EMBODIMENT OF
THIS INVENTION (No. 1)

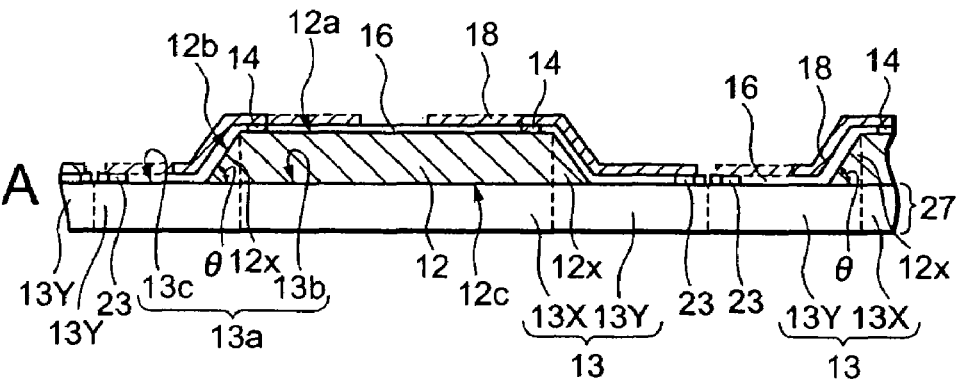
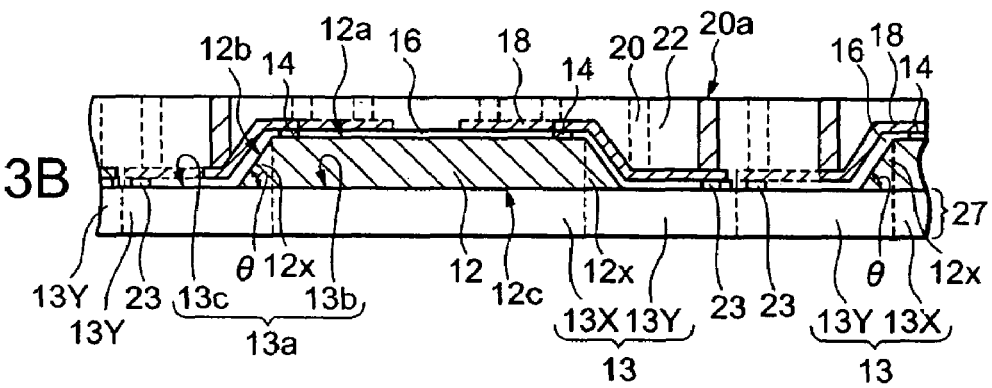
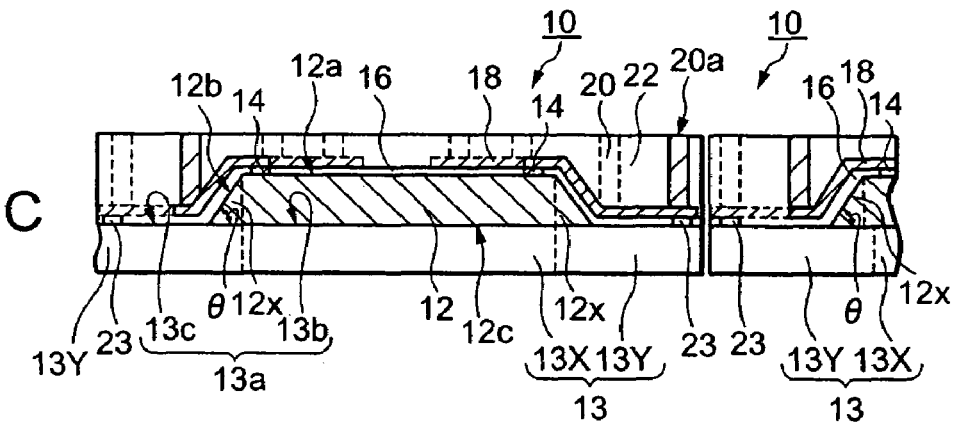
MANUFACTURING STEPS OF SUBSTRATE HAVING BUILT-IN SEMICONDUCTOR APPARATUS ACCORDING TO FIRST EMBODIMENT OF THIS INVENTION (No. 2)

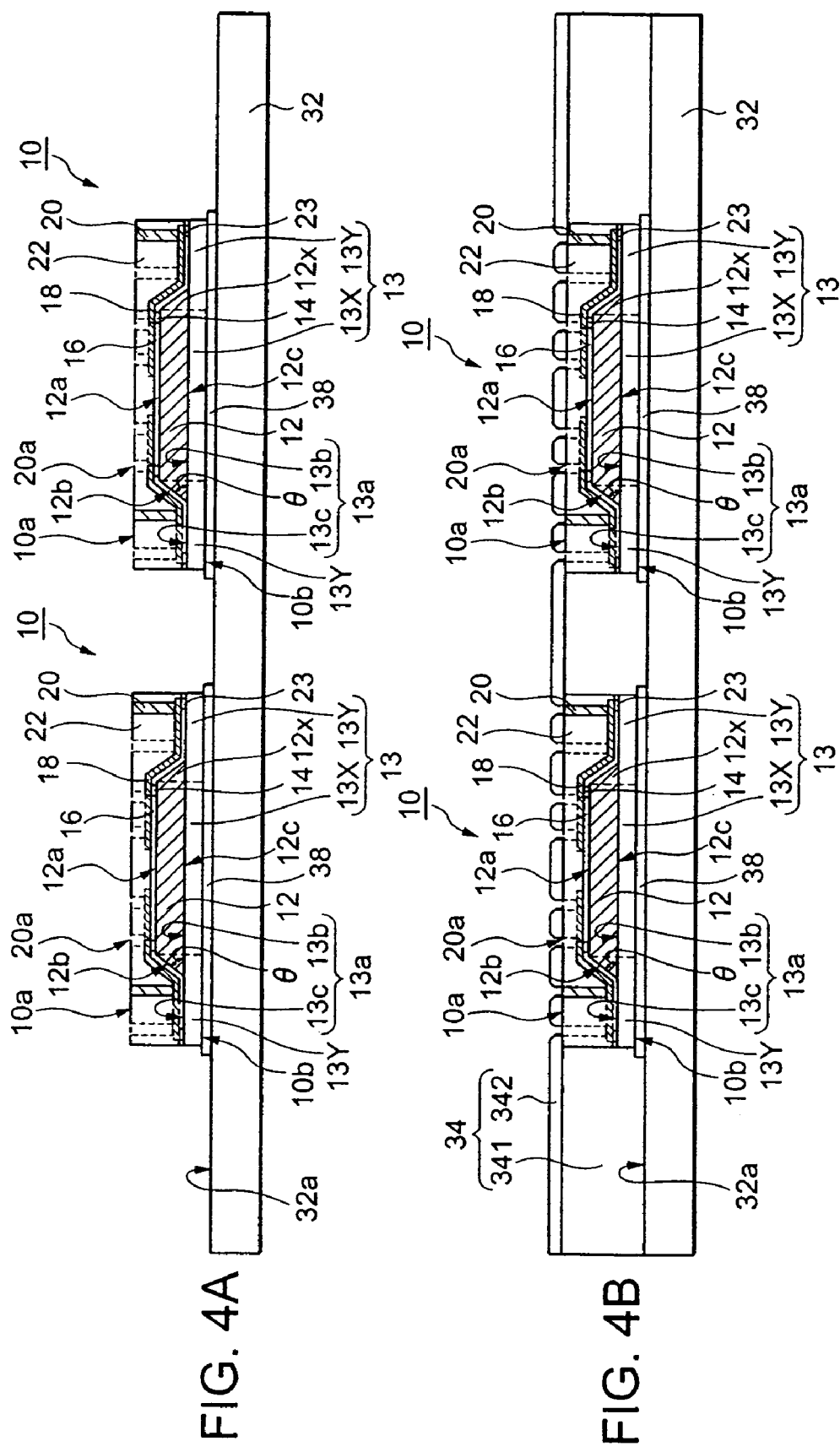

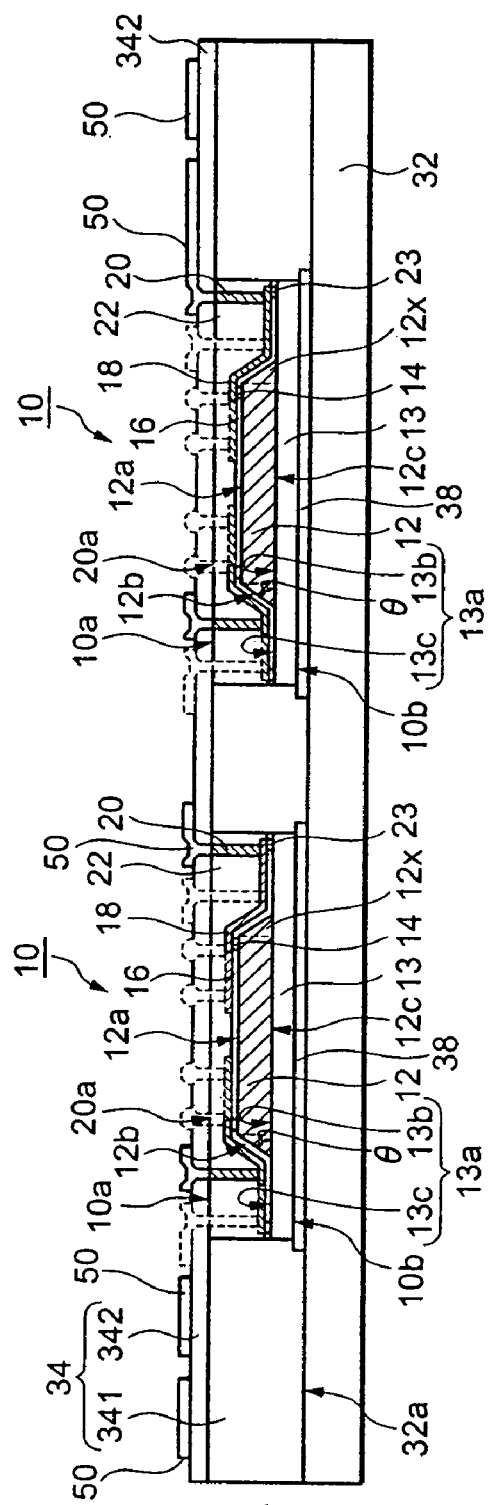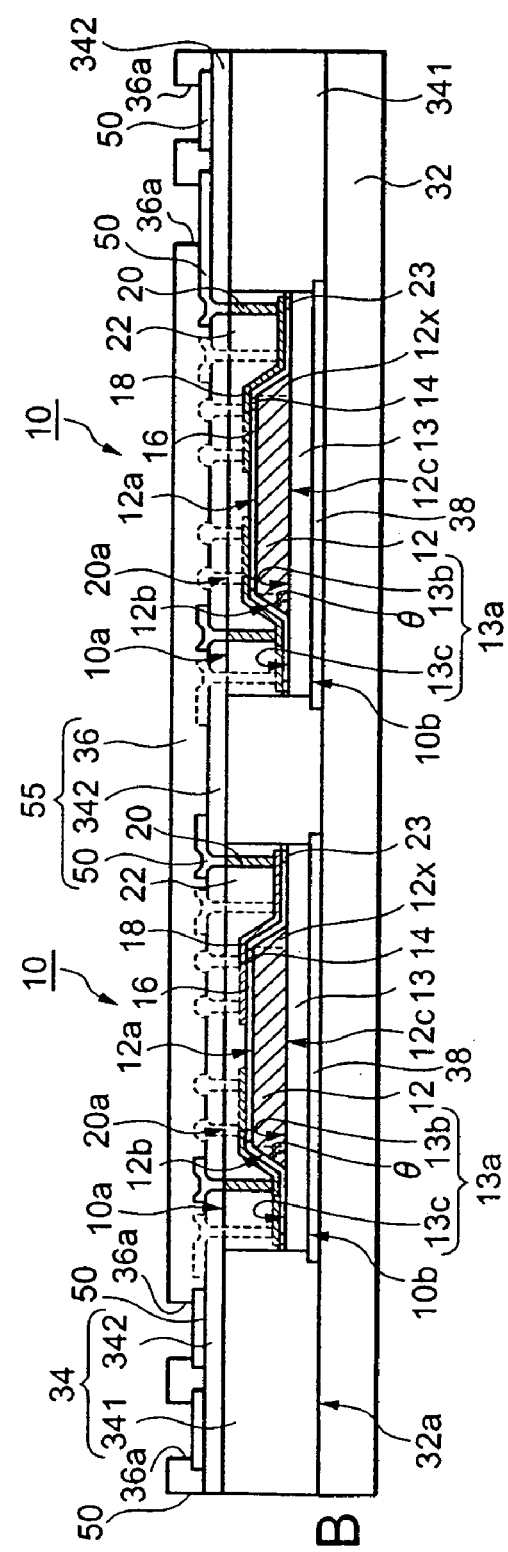
FIG. 5A
FIG. 5B
MANUFACTURING STEPS OF SUBSTRATE HAVING BUILT-IN SEMICONDUCTOR APPARATUS ACCORDING TO FIRST EMBODIMENT OF THIS INVENTION (No. 4)

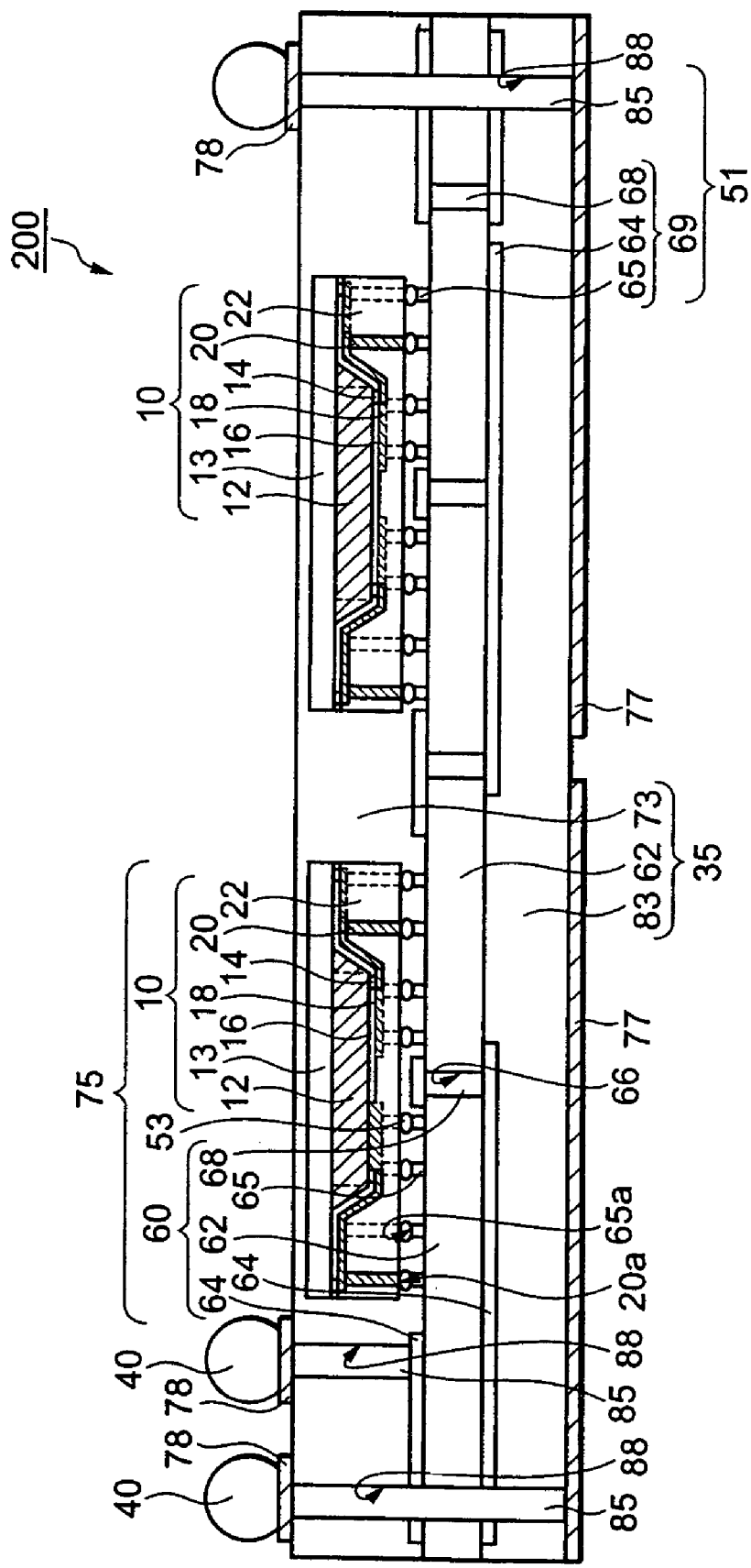

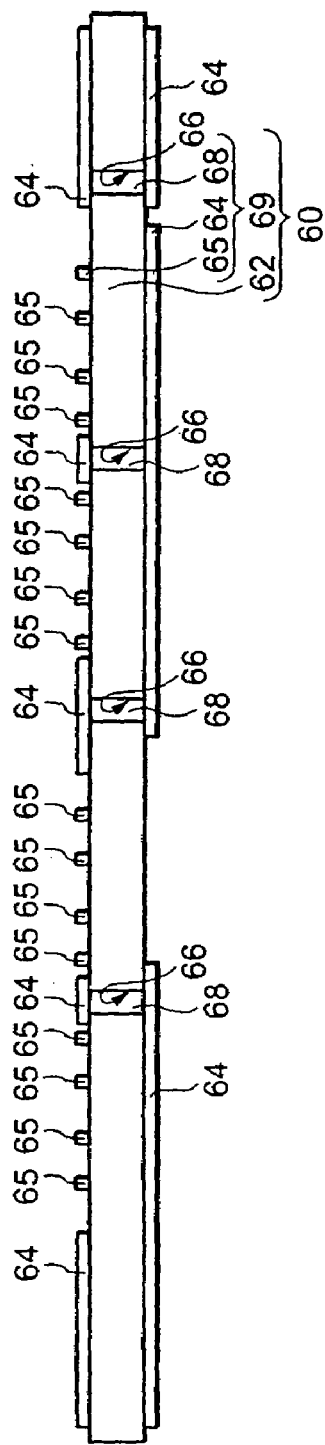
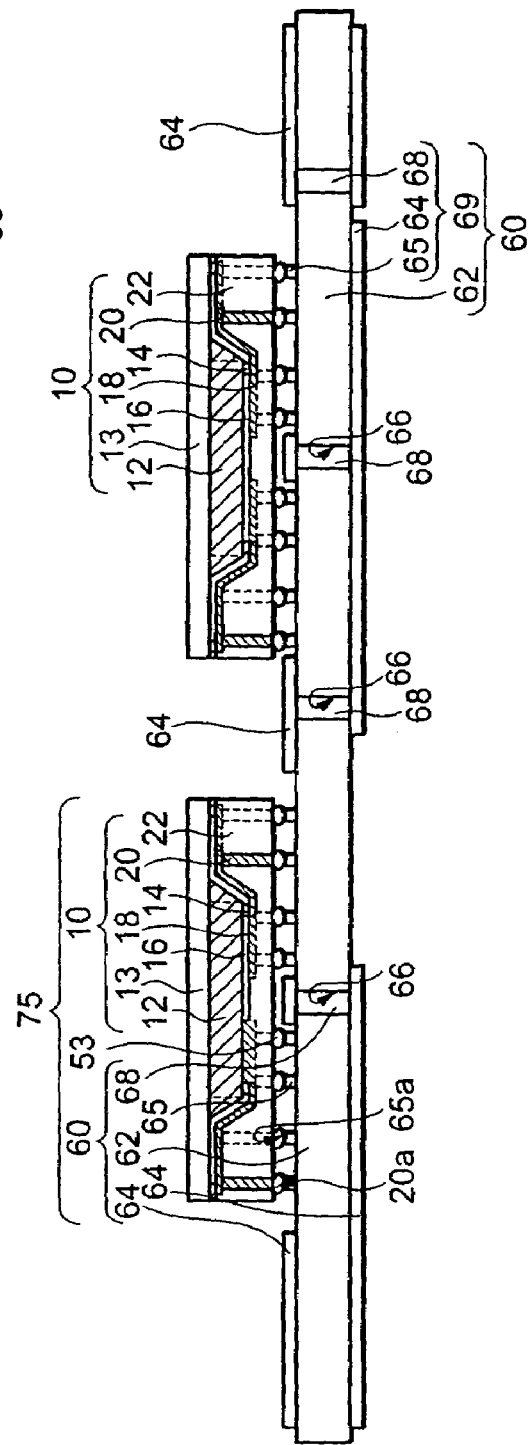
FIG. 7A
FIG. 7B
MANUFACTURING STEPS OF SUBSTRATE HAVING BUILT-IN SEMICONDUCTOR APPARATUS ACCORDING TO SECOND EMBODIMENT OF THIS INVENTION (No. 1)

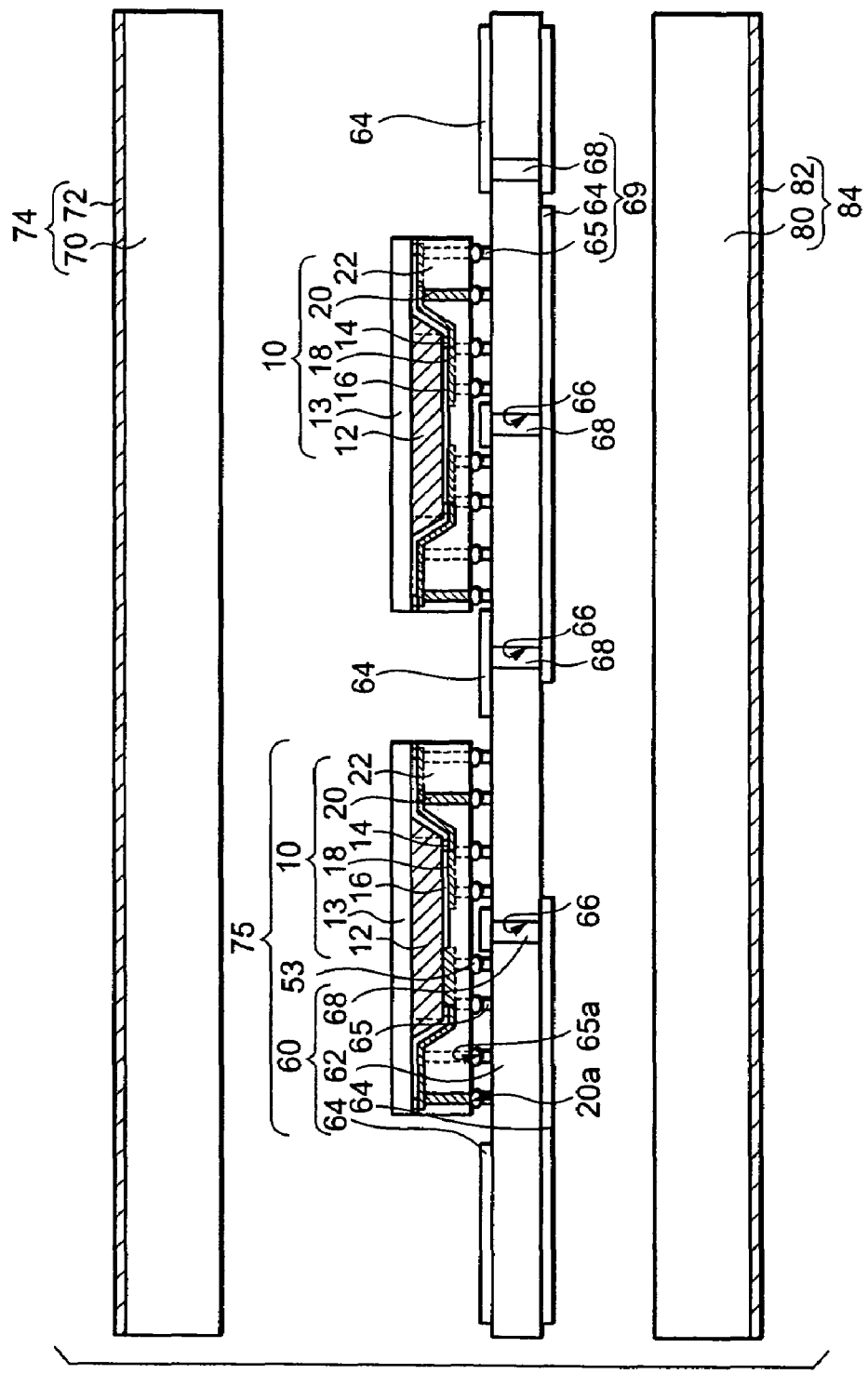

MANUFACTURING STEPS OF SUBSTRATE HAVING BUILT-IN SEMICONDUCTOR APPARATUS ACCORDING TO SECOND EMBODIMENT OF THIS INVENTION (No. 3)

MANUFACTURING METHOD OF SUBSTRATE HAVING BUILT-IN
SEMICONDUCTOR APPARATUS ACCORDING TO THIRD EMBODIMENT OF
THIS INVENTION

MANUFACTURING METHOD OF SUBSTRATE HAVING BUILT-IN SEMICONDUCTOR APPARATUS ACCORDING TO THIRD EMBODIMENT OF THIS INVENTION

MANUFACTURING METHOD OF SUBSTRATE HAVING BUILT-IN SEMICONDUCTOR APPARATUS ACCORDING TO FIFTH EMBODIMENT OF THIS INVENTION

MANUFACTURING METHOD OF SUBSTRATE HAVING BUILT-IN SEMICONDUCTOR APPARATUS ACCORDING TO SIXTH EMBODIMENT OF THIS INVENTION

MANUFACTURING METHOD OF SUBSTRATE HAVING BUILT-IN SEMICONDUCTOR APPARATUS ACCORDING TO EIGHTH EMBODIMENT OF THIS INVENTION

SUBSTRATE HAVING BUILT-IN SEMICONDUCTOR APPARATUS ACCORDING TO 14TH EMBODIMENT OF THIS INVENTION

VIEWS ILLUSTRATING SEMICONDUCTOR APPARATUSES ACCORDING TO THIS INVENTION (No. 1)

VIEWS ILLUSTRATING SEMICONDUCTOR APPARATUSES
ACCORDING TO THIS INVENTION (No. 2)

VIEW ILLUSTRATING A SEMICONDUCTOR APPARATUS
ACCORDING TO THIS INVENTION (No. 3)

SUBSTRATE HAVING BUILT-IN SEMICONDUCTOR APPARATUS AND MANUFACTURING METHOD THEREOF

This application is a divisional of U.S. application Ser. No. 10/742,940, filed Dec. 23, 2003.

BACKGROUND OF THE INVENTION

1. Field of the Invention

The present invention relates to a substrate having a built-in semiconductor apparatus and a manufacturing method thereof.

This application is counterpart of Japanese patent application, Serial Number 336380/2003, filed Sep. 26, 2003, the subject matter of which is incorporated herein by reference.

2. Description of the Related Art

There has been proposed a substrate having a built-in semiconductor chip to which an active element such as a transistor is formed or a substrate having a built-in passive element such as a capacitor or a resistor with a demand for high-density packaging of an electronic device (see, e.g., patent document1).

(Patent Document 1) Japanese patent application laid-open No. 2002-170827

However, a substrate having, e.g., a built-in semiconductor chip has the following problems.

First, in a bare chip state, it is hard to guarantee KGD (Known Good Die: quality assurance chip), i.e., a perfect non-defective unit. As a result, a semiconductor chip which is a defective unit is built in a substrate with a fixed probability. Therefore, in case of an integrated substrate having many built-in semiconductor chips, a further reduction in yield ratio occurs. Furthermore, since burn-in, i.e., a pre-use operation in order to find a defect cannot be carried out before building such chips in the substrate, there is known that an initial percent defective of the integrated substrate is high.

Second, when a pitch (or an interval) between pads provided to a semiconductor chip is narrow, many build-up layers are required when building such a chip in a substrate. Therefore, a product cost per integrated substrate is high, and pulling wirings from pads with a narrow pitch interval to an external terminal on the surface of the integrated substrate becomes complicated. Therefore, there is fear of a reduction in yield ratio.

Thus, there has been recently proposed a new method to build a WCSP (Wafer level Chip Size Package) which is guaranteed as a perfect non-defective unit in a packaging state into a substrate. The WCSP is a package which is obtained by forming an individual piece after performing packaging in a wafer state and has an outside dimension which is substantially equal to a chip size. In the WCSP, a pitch between external terminals can be expanded by a wiring layer (which is also referred to as a redistribution wiring layer) capable of rearranging a position of an external terminal, thereby easing the difficulty in pulling the wirings to the external terminal on the surface of the integrated substrate.

However, with a demand for realization of multi-pin of the WCSP involved by high integration in recent years, many build-up layers are naturally required when a pitch between external terminals must be further narrowed. Therefore, a product cost in an integrated substrate unit is increased, and there is fear of a reduction in yield ratio due to complexity of pulling wirings from pads with a narrow pitch interval to external terminals on the surface of the integrated substrate. It is to be noted that, in 2002, the WCSP having a wiring pitch not more than 25 μm is mass-produced and, on the other hand, a wiring pitch of a build-up substrate is 50 μm and a wiring pitch of a multilayer wiring substrate is 70 μm (Actual Packaging Technology Road Map (JEITA), 2001). It can be understood from this fact that narrowing the wiring pitch in the WCSP rapidly advances.

SUMMARY OF THE INVENTION

It is, therefore, an object of the present invention to provide a substrate having a built-in semiconductor apparatus and a manufacturing method thereof which can further reduce a product cost per substrate.

Therefore, the substrate having a built-in semiconductor apparatus has the following structural characteristics.

That is, according to the present invention, there is provided a substrate having a built-in semiconductor apparatus comprising: a semiconductor apparatus which includes a first semiconductor chip, a protruding portion, an apparatus wiring portion, an conductive portion connected with the apparatus wiring portion and a sealing layer; an insulating layer in which the semiconductor apparatus is embedded; an external terminal provided on the insulating layer; and an substrate wiring portion which electrically connects the conductive portion included in the semiconductor apparatus with the external terminal.

The first semiconductor chip constituting the semiconductor apparatus has a first electrode pad formed on a main surface thereof. The protruding portion is in contact with the first semiconductor chip and provided so as to protrude toward the outside from a side surface of the first semiconductor chip. The apparatus wiring portion is provided so as to extend on a surface of the protruding portion from the first electrode pad. The conductive portion is connected with the apparatus wiring portion and provided on the apparatus wiring portion. The sealing layer covers the main surface of the semiconductor chip and the surface of the protruding portion so as to expose a top face of the conductive portion.

According to this structure, since there is provided the substrate having a built-in semiconductor apparatus guaranteed as a perfect non-defective unit, an operation confirmation does not have to be again performed with respect to the built-in semiconductor apparatus.

Therefore, a yield ratio of the substrate having the built-in semiconductor apparatus is higher than a yield ratio of a conventional substrate having a built-in semiconductor chip in a bare chip state.

Moreover, in this semiconductor apparatus, the redistribution wiring layer which is the apparatus wiring portion from the first electrode pad of the first semiconductor chip can be extended onto the protruding portion provided so as to protrude to the outside from the side surface of the first semiconductor chip.

As a result, a post portion which is the conductive portion electrically connected with the first electrode pad through the apparatus wiring portion can be arranged as a fan-out structure in an outer peripheral area other than the first semiconductor chip.

Therefore, according to the present invention, an interval of the conductive portions can be expanded as compared with a case that the same number of conductive portions are formed to the WCSP. Thus, a degree of freedom of pulling the substrate wiring portion used to electrically conduct the external terminal on the surface of the substrate having the built-in semiconductor apparatus and the conductive portions can be improved as compared with the case of the substrate having the built-in WCSP.

Therefore, the substrate having the built-in semiconductor apparatus according to the present invention can be constituted of layers which is not more than the layers of the build-up substrate required to build in the WCSP, a reduction in production cost per integrated substrate unit can be expected.

BRIEF DESCRIPTION OF THE DRAWINGS

FIGS. 3A to 3C are schematic cross-sectional views (No. 2) illustrating manufacturing steps of the substrate having a built-in semiconductor apparatus according to the first embodiment of the present invention;

FIGS. 4A and 4B are schematic cross-sectional views (No. 3) illustrating manufacturing steps of the substrate having a built-in semiconductor apparatus according to the first embodiment of the present invention;

FIGS. 5A and 5B are schematic cross-sectional views (No. 4) illustrating manufacturing steps of the substrate having a built-in semiconductor apparatus according to the first embodiment of the present invention;

FIG. 6 is a schematic cross-sectional view illustrating a substrate having a built-in semiconductor apparatus according to a second embodiment of the present invention;

FIGS. 7A and 7B are schematic cross-sectional view (No. 1) illustrating manufacturing steps of the substrate having a built-in semiconductor apparatus according to the second embodiment of the present invention;

FIG. 8 is a schematic cross-sectional view (No. 2) illustrating manufacturing steps of the substrate having a built-in semiconductor apparatus according to the second embodiment of the present invention;

DETAILED DESCRIPTION OF THE PREFERRED EMBODIMENT

Figure 1:
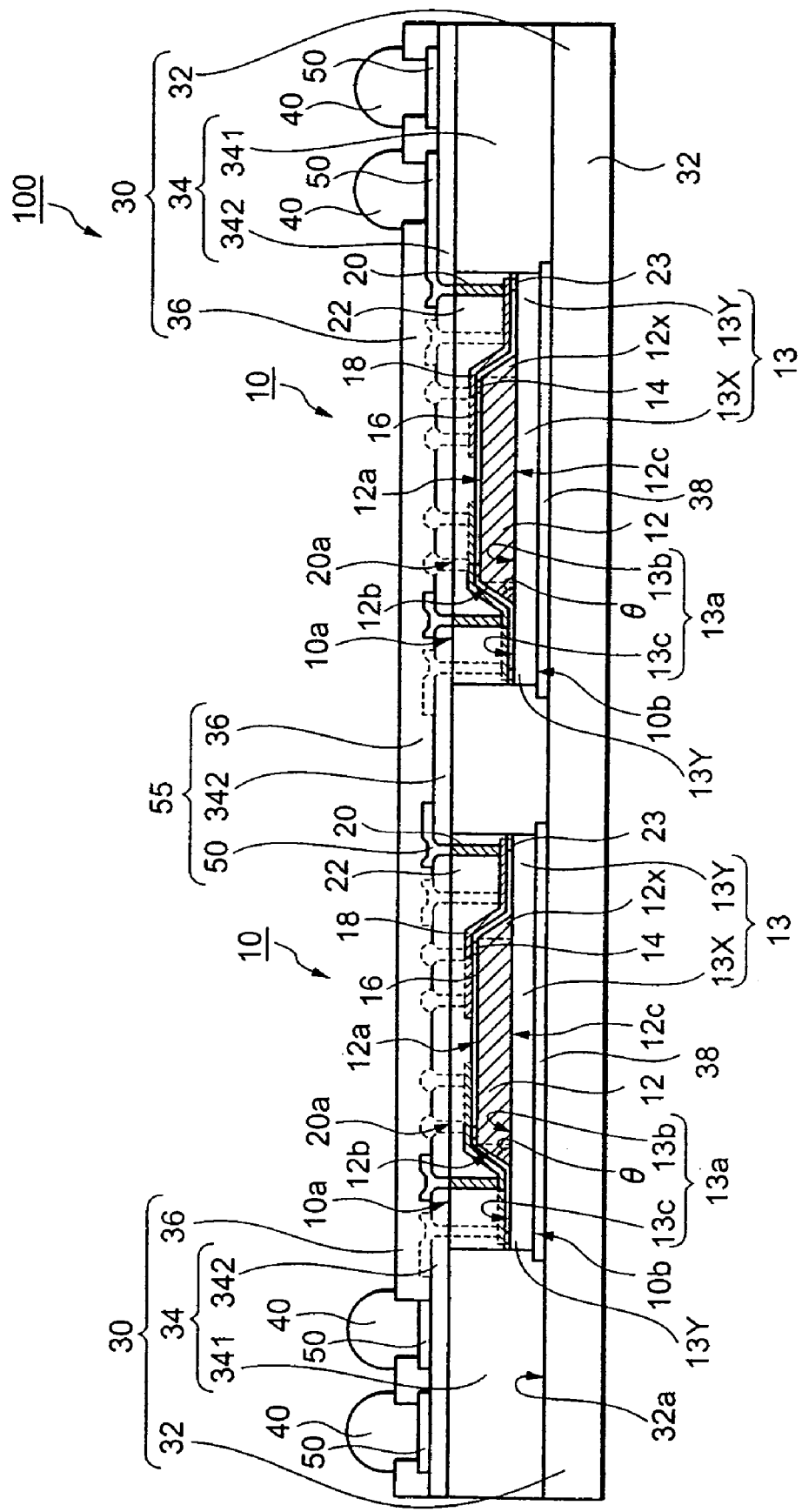
FIG. 1 is a schematic cross-sectional view illustrating a substrate having a built-in semiconductor apparatus according to a first embodiment of the present invention.

Embodiments according to the present invention will now be described hereinafter with reference to FIGS. 1 to 25. It is to be noted that each drawing schematically shows a structural example of a semiconductor apparatus according to the present invention. Additionally, each drawing only schematically show a shape, a dimension and an arrangement relationship of each constituent component so that the present invention can be understood, and the present invention is not restricted to these illustrated examples. Further, in order to facilitate understanding of the drawings, hatching (i.e., oblique lines) indicating a cross section is eliminated expect some parts. Furthermore, although specific materials, conditions and others may be used in the following description, these materials and conditions are just one of preferred examples, and hence the present invention is not restricted thereto. Moreover, like reference numerals denote the same constituent component in each drawing, thereby eliminating tautological explanation.

First Embodiment

A substrate having a built-in semiconductor apparatus and a manufacturing method thereof according to the first embodiment will now be described with reference to FIGS. 1 to 5. FIG. 1 is a cross-sectional view schematically illustrating how connections and arrangements of respective constituent elements of a substrate having a built-in semiconductor apparatus 100 are achieved. FIGS. 2 to 5 are process charts illustrating a manufacturing method of the substrate having a built-in semiconductor apparatus 100, and respective drawings of process stages are cross-sectional views schematically showing structures obtained on the process stages.

As shown in FIG. 1, the substrate having a built-in semiconductor apparatus 100 according to this embodiment comprises a semiconductor apparatus 10, an insulating layer 30 in which the semiconductor apparatus 10 is embedded, an external terminal 40 provided on the insulating layer 30, and an substrate wiring portion 50 which electrically connects the external terminal 40 with a later-described conductive portion 20 included in the semiconductor apparatus 10.

The detail of the semiconductor apparatus 10 according to this embodiment will be first described.

The semiconductor apparatus 10 mainly includes a first semiconductor chip 12, a protruding portion 13Y, an apparatus wiring portion 18, an conductive portion 20 and a sealing layer 22.

In this structural example, the semiconductor chip means a semiconductor piece which is cut out from a semiconductor wafer and includes a circuit element. Further, the semiconductor apparatus means a package sealed by using a resin material or the like in a state that the semiconductor chip can be electrically connected with the outside.

In this structural example, the semiconductor apparatus 10 comprises the first semiconductor chip 12 and the protruding portion 13Y which protrudes to the outer side from the side surface of the first semiconductor chip 12. Here, this protruding portion 13Y is constituted by using a part of a support 13. Preferably, it is good enough to determine this support 13 as a second semiconductor chip. Therefore, the protruding portion 13Y is formed of the part of the second semiconductor chip 13. The second semiconductor chip 13 has a loading surface 13a on which the first semiconductor chip 12 is loaded, and the loading surface 13a is larger than an outside dimension of the first semiconductor chip 12. Therefore, when the first semiconductor chip 12 is mounted on the second semiconductor chip 13 and a superimposed state of the both chips is seen from the above in the two-dimensional manner, the part of the second semiconductor chip 13 protruding around the first semiconductor chip 12 forms the protruding portion 13Y. In the drawing, the part of the semiconductor chip which is hidden by the first semiconductor chip 12 mounted thereon (which is also referred to as a central area) is denoted by reference character 13X, and the part forming the protruding portion in a peripheral area of the central area 13X is designated by reference character 13Y. It is to be noted that the protruding portion 13Y may be provided at any position as well as all the peripheries on four sides of the first semiconductor chip. Furthermore, of the loading surface 13a, a part on which the first semiconductor chip 12 is actually mounted, i.e., a part facing a rear surface 12c opposed to a main surface 12a of the first semiconductor chip 12 is referred to as a mount surface 13b. Moreover, first electrode pads 14 consisting of aluminum (Al) are arranged on the main surface 12a of the first semiconductor chip 12 at predetermined intervals.

The semiconductor apparatus 10 in this structural example has a stack type MCP (Multi Chip Package) structure that the first semiconductor chip 12 is stacked (laminated) on the mount surface 13b of the semiconductor chip 13 and high-density packaging is possible. It is to be noted that each of the first and second semiconductor chips has a square plane shape in this example but it may have an arbitrary preferred shape.

That is, second electrode pads 23 consisting of aluminum are arranged on the loading surface 13a of the second semiconductor chip 13 at predetermined intervals, and the second electrode pad 23 is electrically connected with the first electrode pad 14 of the first semiconductor chip 12 through an apparatus wiring portion (which may be referred to as a redistribution wiring layer hereinafter in some cases) 18. It is to be noted that the number and positions of the first electrode pads 14 and the second electrode pads 23 to be arranged can be determined as an arbitrary preferable number and positions in accordance with a design.

Additionally, when the first semiconductor chip 12 is a chip with a square shape, its four side walls 12x are inclined walls. A side wall surface (inclined side wall surface) 12b of each of the inclined walls crosses the mount surface 13b at a sharp angle $\theta$ ($0°<\theta<90°$). Preferably, it is good to set this crossed axes angle $\theta$ to be a value within a range of 45° to 60°. That is because the number of the first semiconductor chips to be collected per wafer can be increased and a margin to avoid a chip damage due to blurring of a blade or the like when forming an individual piece for each chip can be assured by doing so.

Further, in the following description, of the loading surface 13a of the second semiconductor chip, an area of the first semiconductor chip 12 which excludes the mount surface 13b and surrounds the loading surface 13b is referred to as a non-mount surface 13c. That is, this non-mount surface 13c corresponds to a surface of the above-described protruding portion 13Y.

Furthermore, an insulating film 16 obtained by exposing an end portion, e.g., a top face of each first electrode pad 14 on the main surface 12a of the first semiconductor chip 12 is provided on the main surface 12a, the side wall surface 12b and the non-mount surface 13c of the first semiconductor chip 12. This insulating film 16 is formed by sequentially providing, e.g., a passivation film and a protection film. Here, the passivation film is formed of, e.g., a silicon oxide film ($SiO_2$). Moreover, the protection film is formed of a film material with a low hardness like polyimide, for example. The protection film can prevents an impact shock relative to the first semiconductor chip 12 in manufacturing steps or peeling due to a stress between the sealing layer 22 and the semiconductor chip 12.

Additionally, the first electrode pad 14 is electrically individually connected through a post portion consisting of copper (Cu), i.e., the conductive portion 20 and the dedicated redistribution wiring layer 18. The redistribution wiring layer 18 in this structural example functions as a redistribution wiring layer which rearranges the first electrode pads 14 by using the conductive portion 20 provided at a position opposed to the non-mount surface 13c, and it is formed of copper.

Further, the redistribution wiring layer 18 in this structural example has one end thereof connected to the first electrode pad 14, and it is provided so as to climb on the side wall surface 12b of the first semiconductor chip 12 and the non-mount surface 13c from the first electrode pad 14. Therefore, this redistribution wiring layer 18 bends and extends in accordance with a vertical interval (step) between the main surface 12a of the first semiconductor chip 12 and the non-mount surface 13c. Furthermore, the redistribution wiring layer 18 is electrically connected with the conductive portion allocated as a connection destination of the first electrode pad 14, i.e., the post portion 20.

Moreover, the sealing layer 22 which covers the insulting film 16, the redistribution wiring layer 18 and the like is formed on the upper sides of the main surface 12a and the side wall surface 12b of the first semiconductor chip 12 and the non-mount surface 13c. This sealing layer 22 embeds the periphery of the post portion 20 and exposes an end portion (top face) 20a of the post portion 20. In this structural example, a surface 10a of the semiconductor apparatus is formed of the upper surface of the sealing layer 22 and the top face 20a of the post portion 20, and the surface 10a in this example is substantially flat. Incidentally, it is preferably good to form the sealing layer 22 by using a usually utilized material such as a epoxy resin.

An output signal from the first semiconductor chip 12 in this structural example is transmitted along both or one of a path reaching an external terminal 40 from the first electrode pad 14 via a later-described substrate wiring portion 50 through the redistribution wiring layer 18 and the post portion 20 and a path reaching the second semiconductor chip 13 from the first electrode pad 14 through the redistribution wiring layer 18 and the second electrode pad 23. Furthermore, an input signal from the external terminal 40 or the second semiconductor chip 13 is transmitted through the above-described paths in the opposite direction. It is to be noted that the transmission paths are not restricted those mentioned above, and they can be formed as various wiring paths in accordance with an object or a design (which is also true in each of the following embodiments).

Now, as shown in FIG. 1, according to the substrate having a built-in semiconductor apparatus 100 of this embodiment, the semiconductor apparatus 10 is fixed on a loading surface 32a of a base material 32 through a die bonding agent 38. In this example, a sheet type pre-preg hardened layer in which a pre-preg is hardened is used as the base material 32. The pre-preg is a thermosetting resin reinforced by using paper, fibers and the like, and this is an insulating material which is used in a hardened state. It is to be noted that two semiconductor apparatuses 10 are arranged on the base material 32 at a predetermined interval as an example herein, but the number or intervals of the semiconductor apparatuses 10 can be arbitrarily preferably set in accordance with an object or a design.

Moreover, a first insulating layer 34 is formed on the base material 32 and the first semiconductor apparatus 10 so as to expose the top face 20a of the post portion 20 of the semiconductor apparatus. Specifically, the first insulting layer 34 includes an enveloping portion 341 which is a part having substantially the same height as the surface 10a of the semiconductor apparatus 10 from the base material 32 and consists of an epoxy resin, and a coating portion 342 which is formed on the enveloping portion 341 and the first semiconductor chip 12, exposes the top face 20a of the post portion 20 and consists of a photosensitive epoxy resin or BCB (Benzocyclobutene). The substrate wiring portion 50 consisting of copper (Cu) extends on the first insulating layer 34 from the post portion 20. Additionally, a second insulating layer 36 consisting of a photosensitive epoxy resin or BCB is formed on the first insulating layer 34 and the substrate wiring portion 50 so as to expose a part of the surface of the substrate wiring portion 50.

That is, the insulating layer 30 embedding the semiconductor apparatus 10 in this embodiment is an insulative member embedding the semiconductor apparatus 10, and has a structure mainly including the base material 32, the first insulating layer 34 (341, 342) and the second insulating layer 36.

Each solder ball 40 as an external terminal used to achieve a connection with a packaging substrate is formed on the substrate wiring portion 50, and the solder ball 40 is electrically individually connected with the post portion 20 through the dedicated substrate wiring portion 50. Thus, the substrate wiring portion 50 in this structural example can arrange the solder ball 40 at a desired position on a substantially horizontal plane without depending on a horizontal position of the post portion 20, i.e., a position shifted to the upper side from the first semiconductor apparatus 10 in the horizontal direction. It is to be noted that a build-up layer 55 used to electrically conduct the external terminal 40 and the post portion 20 is configured to include the coating portion 342, the substrate wiring portion 50 and the second insulating layer 36 in this embodiment.

A manufacturing method of this substrate having a built-in semiconductor apparatus 100 will now be described with reference to FIGS. 2 to 5.

As a first step, the above-described semiconductor apparatus 10 is first prepared. Specifically, the first step includes a side wall surface forming step, a loading step, a redistribution wiring layer forming step and a post portion forming step which will be described later.

Figure 2A:
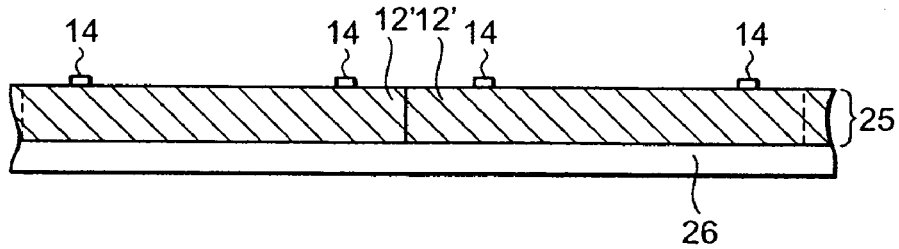
FIGS. 2A to 2C are schematic cross-sectional views (No. 1) illustrating manufacturing steps of the substrate having a built-in semiconductor apparatus according to the first embodiment of the present invention.

The side wall surface forming step will be first explained. There is prepared a semiconductor wafer 25 which includes a plurality of first semiconductor chips 12' (chip size is determined as, e.g., approximately 7 mm×approximately 7 mm) before formed into individual pieces. As shown in FIG. 2A, first electrode pads 14 are formed at a predetermined interval (pitch) of, e.g., 0.035 mm to 0.18 mm on a main surface of the first semiconductor chip 12' before formed into an individual piece. The back side of the semiconductor wafer 25 is adhered and fixed by a wafer fixing tape 26 on which an adhesive (not shown) is applied. It is to be noted that the drawing shows approximately two first semiconductor chips 12' before formed into individual pieces for the convenience's sake. Further, a scribe line (not shown) of approximately 0.08 mm is formed between the adjacent first semiconductor chips 12' before formed into individual pieces in the semiconductor wafer 25.

Figure 2B:
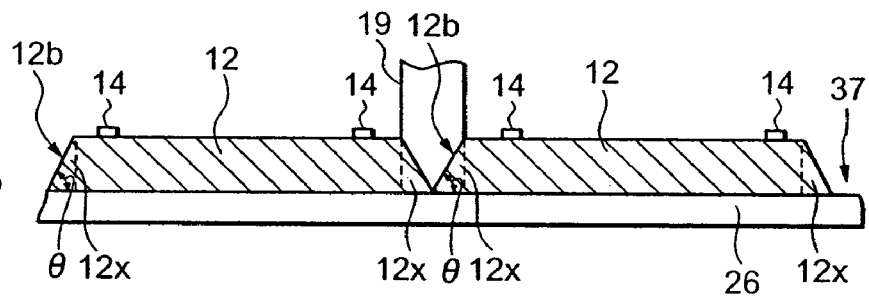

Then, as shown in FIG. 2B, an individual piece is formed in accordance with each first semiconductor chip 12, namely, the first semiconductor chips 12 are separated along the scribe line (not shown) by using a blade (cutting tool) 19 which rotates at a high speed. A cutting edge of the blade 19 used herein has an angle (apex angle) φ (e.g., approximately $60°<\phi<90°$) such that a cross-sectional shape of its tip has a V shape. At this time, with formation of a groove 37 cut into a V shape, an inclined side wall surface 12b forming an acute angle θ ($0°<\theta<90°$) is formed on a side wall 12x of the first semiconductor chip 12. Thereafter, the adhesion of the adhesive is lowered by UV irradiation or the like, and each first semiconductor chip 12 is separated from the wafer fixing tape 26.

Figure 2C:
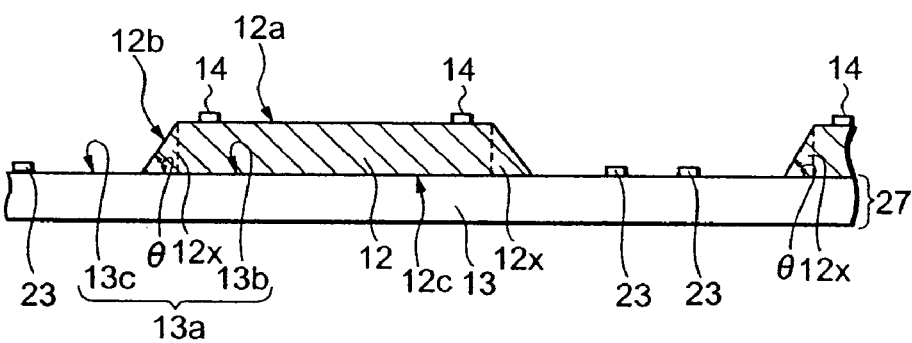

Then, as the loading step, as shown in FIG. 2C, each first semiconductor chip 12 formed into an individual piece is mounted and fixed on the support 13 through a die bonding agent (not shown). It is to be noted that the support is determined as a semiconductor wafer 27 on which the respective second semiconductor chips 13 before formed into individual pieces are arranged in this structural example. The first semiconductor chip 12 is fixed on each second semiconductor chip 13 having second electrode pads 23 formed at a predetermined intervals, e.g., 0.035 mm to 0.18 mm thereon.

The redistribution wiring layer forming step will now be described. As shown in FIG. 3A, an insulating layer 16 consisting of a laminated film is formed so as to cut across the main surface 12a and the side wall surface 12b of the first semiconductor chip 12 and the non-mount surface 13c. This film formation is achieved by sequentially laminating a silicon oxide film and a polyimide film by a regular film forming method. In this case, film formation is carried out so as to expose the top face of the first electrode pad 14 and the top face of the second electrode pad 23 connected to the redistribution wiring layer 18 from the insulating film 16. Since there is a vertical interval (step) between the main surface 12a of the first semiconductor chip 12 and the non-mount surface 13c which constitute an underlying surface of the insulating film 16, the formed insulating film 15 is configured to bend in accordance with this step.

Thereafter, a redistribution wiring layer 18 consisting of copper is formed on the insulating film 16 so as to extend from the side wall surface 12b of the inclined wall (side wall) 12x to the non-mount surface 13c. Preferably, this redistribution wiring layer 18 is formed so as to bend and extend in accordance with the vertical interval between the main surface 12a and the non-mount surface 13c in such a manner that one end thereof is connected with the first electrode pad 14. It is preferable to form the redistribution wiring layer 18 by patterning such as photolithography or sputtering. At this time, patterning is carried out in such a manner that the other end of the part of the redistribution wiring layer 18 which is extended from the first electrode pad 14 in accordance with a design is connected to the second electrode pad 23 in a one-on-one relationship.

The post portion forming step will now be described. As shown in FIG. 3B, a post portion 20 consisting of copper is first formed by photolithography, plating or the like on the redistribution wiring layer 18 extending on the surface of each insulating film 16 on the non-mount surface 13c. Thereafter, a sealing layer 22 consisting of an epoxy resin is formed on the loading surface 13a side of the second semiconductor chip 13 having the post portion 20 formed thereon by a transfer molding method until the post portion 20 is hidden. Then, the top faces 20a of all the post portions 20 are exposed by a grinder or the like. In this structural example, a minimum interval (pitch) between the adjacent post portions 20 can be expanded to, e.g., not less than 0.3 mm. Thereafter, each semiconductor apparatus 10 is cut out by using a high-speed rotating blade for usual scribing (FIG. 3C). The thus formed semiconductor apparatus 10 becomes a semiconductor apparatus to be incorporated into the substrate having a built-in semiconductor apparatus.

Subsequently, as a second step, there are formed an insulating layer 30 embedding the semiconductor apparatus 10, an external terminal 40 formed on the insulating layer 30, and an substrate wiring portion 50 which electrically connects the post portion 20 as the conductive portion included in the semiconductor apparatus 10 with the external terminal 40. Specifically, the second step includes a semiconductor apparatus fixing step, a first insulating layer forming step, an substrate wiring portion forming step, a second insulating layer forming step and an external terminal forming step which will be described later.

The semiconductor apparatus fixing step will be first explained. As shown in FIG. 4A, in this structural example, each of the two semiconductor apparatuses 10 having the above-described structure is fixed on the loading surface 32a of the base material 32 by using a die boding agent 38 at a predetermined interval according to a design. In this structural example, a hardened pre-preg sheet is preferably used as the base material 32.

Subsequently, as shown in FIG. 4B, the first insulating layer forming step is carried out. An enveloping portion 341 consisting of an epoxy resin is formed on the base material 32 by embedding the epoxy resin around the semiconductor apparatus 10 up to substantially the same height as the surface 10a of the semiconductor apparatus 10. Thereafter, a coating portion 342 is formed on the enveloping portion 341 and the exposed surface of the semiconductor apparatus 10 so as to expose the top face 20a of each post portion 20 of the semiconductor apparatus 10. The first insulating layer 34 is formed by the thus formed enveloping portion 341 and coating portion 342.

Then, as shown in FIG. 5A, the substrate wiring portion forming step is performed. In this step, the substrate wiring portion 50 consisting of copper is patterned by photolithography, sputtering or the like. This substrate wiring 50 is formed as a wiring which has one end thereof connected to the top face 20a of the post portion 20 included in the semiconductor apparatus 10 and extends from the top face 20a onto the first insulating layer 34.

Subsequently, as shown in FIG. 5B, the second insulating layer forming step is performed. In this step, a second insulating layer 36 consisting of an epoxy resin or the like is formed on the coating portion 342 and the substrate wiring portion 50 by using a photosensitive epoxy resin. To this second insulating layer 36 is formed each opening portion 36a in which an external terminal electrically connected with the substrate wiring 50 is formed.

Thereafter, the external terminal forming step is conducted. Each solder ball 40 as an external terminal is formed on the substrate wiring 50 exposed to the opening 36a of the second insulating layer 36, thereby bringing the substrate having a built-in semiconductor apparatus 100 to completion (see FIG. 1). Incidentally, when any other active element or passive element is integrated in place of the above-described semiconductor apparatus 10, this can be performed by constituting an assembly structure of a necessary element and then incorporating it into the base material 32 like the case of the semiconductor apparatus 10. Further, although the description has been given as to the case that the support 13 is the second semiconductor chip in this structural example, the support 13 may be a wiring structure or the like which is not referred to as a chip used to increase a degree of integration by forming a multilayer.

As apparent from the above description, according to this embodiment, since there is provided the substrate having a built-in semiconductor which is guaranteed as a perfect non-defective unit, an operation confirmation does not have to be again performed with respect to the built-in semiconductor apparatus.

Therefore, a yield ratio of the substrate having a built-in semiconductor apparatus is higher than a yield ratio of a conventional substrate having a built-in semiconductor chip in a bare chip state.

Furthermore, in the semiconductor apparatus according to this embodiment, the redistribution wiring layer 18 as the apparatus wiring portion can be extended from the first electrode pad 14 included in the first semiconductor chip 12 onto the protruding portion 13.

As a result, the conductive portion electrically connected with the first electrode pad 14 through the redistribution wiring layer 18, i.e., the post portion 20 can realize a fan-out structure arranged in an area other than the first semiconductor chip 12. That is, according to the semiconductor apparatus of this embodiment, an interval of the conductive portions 20 can be expanded as compared with the case that the same number of conductive portions are formed in the WCSP.

Moreover, each conductive portion 20 can be electrically connected with each external terminal 40 arranged at an arbitrary position shifted to the upper side from the semiconductor apparatus 10 in the horizontal direction by the build-up layer 55 having the coating portion 342, the substrate wiring portion 50 and the second insulating layer 36.

Therefore, a degree of freedom of pulling the substrate wiring portion 50 used to electrically conduct the external terminal 40 formed on the surface of the integrated substrate an the conductive portion 20 can be increased as compared with the case of the substrate having a built-in WCSP.

Additionally, since the substrate having a built-in semiconductor apparatus according to the present invention can be constituted by using the layers whose number is not more than the number of layers of the build-up substrate required when incorporating the WCSP therein, a reduction in a product cost per integrated substrate unit can be expected.

Further, the semiconductor apparatus 10 according to this embodiment has a stack type MCP structure in which the protruding portion 13 is the second semiconductor chip. Therefore, the number of output terminals as MCP can be decreased by an inter-chip wiring between the first semiconductor chip 12 and the second semiconductor chip 13, which is effective for a further reduction in the number of build-up layers. Furthermore, with a realization of high density of the semiconductor apparatus itself based on the MCP structure, the substrate having a built-in semiconductor apparatus can be reduced in size.

Moreover, each function block constituting a system of the completed substrate can be configured of the MCP which has been already subjected to the operation confirmation as a perfect non-defective unit. Therefore, as to electrical function tests of the entire system of the substrate, performing only the operation confirmation between the function blocks can suffice. Thus, the tests can be simplified as compared with the case that all the functions of the entire system are operated and the function tests are conducted.

Second Embodiment

The second embodiment according to the present invention will now be described with reference to FIGS. 6 to 9.

FIGS. 6 to 9 are schematic cross-sectional views illustrating a substrate having a built-in semiconductor apparatus and a manufacturing method thereof according to this embodiment. It is to be noted that like reference numerals denote the same constituent elements equal to those which have been already described in connection with the first embodiment, thereby eliminating their concrete explanation (this is also the same in each of the following embodiments).

In this embodiment, a main difference from the first embodiment lies in that a substrate having a built-in semiconductor apparatus 200 is constituted by using a pre-preg hardened layer which includes an electric conductor patterned on a surface thereof and has a pair of hardened pre-pregs in place of the build-up layer.

As shown in FIG. 6, the substrate having a built-in semiconductor apparatus 200 according to this embodiment comprises a semiconductor apparatus 10, an insulating layer 35 embedding the semiconductor apparatus 10, an external terminal 40 provided on the insulating layer 35, and an substrate wiring portion 51 which electrically connects the external terminal 40 with a post portion 20 which is an conductive portion included in the semiconductor apparatus 10.

Specifically, in the substrate having a built-in semiconductor apparatus 200 according to this embodiment, a top face 20a of each post portion 20 of the semiconductor apparatus 10 is fixed on a surface 65a of each electrode pad 65 of a wiring substrate 60 through each solder ball 53, thereby constituting a composite substrate 75. Further, this composite substrate 75 is embedded from the both sides in the first and second pre-preg hardened layers (73, 83) as a pair of insulative resin layers. Furthermore, the wiring substrate 60 is a substrate having a first conductive wiring 69 as a member in the substrate wiring portion 51 being formed on both surfaces and between both surfaces of a plate-like portion 62. This plate-like portion 62 constitutes a part of the insulating layer 35, and it is good to form this portion by preferably using a glass epoxy base material.

The first conductive wiring 69 in this example includes a wiring 64 which is patterned on the surface of the glass epoxy base material 62 and consists of a copper foil, each electrode pad 65, and each conductive portion 68 which pierces the two sides of the base material 62 and electrically connects the wiring 64 and the electrode pad 65. Moreover, a wiring 77 or a land 78 is patterned at a predetermined position on the outer surfaces of the first and second pre-preg hardened layers (73, 83) by using a copper foil which is an electric conductor. The wiring 77 and the land 78 are electrically connected with the conductor portion 85 which pierces the two sides of the substrate having a built-in semiconductor apparatus 200. The conductor portion 85 is a second conductive wiring constituting the substrate wiring portion 51. The external terminal 40 is formed on each land 78. That is, the substrate wiring portion 51 in this embodiment is configured to include the first conductive wiring 69 and the second conductive wiring 85.

A manufacturing method of this substrate having a built-in semiconductor apparatus 200 will now be described hereinafter with reference to FIGS. 7 to 9.

As a first step, like the first embodiment, a semiconductor apparatus 10 is first prepared (see FIGS. 2A to 3C).

The second step includes a wiring substrate preparing step, a composite substrate forming step, a resin formed plate arranging step, a thrusting step, a hardened resin layer forming step, and a second conductive wiring forming step mentioned below.

Referring to FIG. 7A, a wiring substrate 60 is first prepared. The wiring substrate 60 includes a glass epoxy base material 62 and a first conductive wiring 69. The glass epoxy base material 62 is a plate-like portion constituting one layer in an insulating layer 35. Moreover, the first conductive wiring 69 constitutes one member in an substrate wiring portion 51. The first conductive wiring 69 includes each wiring 64, each electrode pad 65 and each conductor portion 68. The conductor portion 68 is formed by, e.g., forming a through hole 66 which pierces the two sides of the base material 62 by using a drill or the like before forming the wiring 64 on the surface of the base material 62, and then filling copper in this through hole 66 by a plating method and the like.

Then, as shown in FIG. 7B, the composite substrate forming step is performed. In this step, a surface 65a of the electrode pad 65 and a top surface 20a of a post portion 20 of the semiconductor apparatus 10 are connected so as to face each other, thereby forming a composite substrate 75.

Specifically, when connecting the surface 65a of the electrode pad 65 with the top face 20a of the post portion 20, a solder paste is supplied onto the electrode pad 65 by a screen printing method and the like. Thereafter, the positioned post portion 20 is mounted on the electrode pad 65, a solder ball 53 is formed by a reflow method, and the both members are connected to each other. Then, there is performed an under-filling step that an epoxy resin with fillers is injected into a gap between the semiconductor apparatus 10 and the wiring substrate 60 according to needs, thereby sealing. It is to be noted that reflow may be carried out by using a fusing agent such as a flux. Additionally, when the flux is used, the flux or the like may be cleansed and removed according to needs after reflow forming. Further, as to the connection of the surface 65a of the electrode pad 65 with the top face 20a of the post portion 20, it is possible to preferably select, e.g., bonding using a flip chip or an conductive paste in a reduced atmosphere or an inactive atmosphere, a normal-temperature bonding with a surface oxide layer being removed and the like as well as the above-described reflow method.

Then, as shown in FIG. 8, the resin formed plate arranging step is carried out. In this step, there are prepared a pair of a first resin formed plate 74 in which a metal plate 72 is attached on a pre-preg 70 as an insulative resin layer by thermo compression bonding and a second resin formed plate 84 in which a metal plate 82 is attached on a pre-preg 80 as an insulative resin layer with a predetermined thickness by thermo compression bonding. In this structural example, the metal plate is a copper foil, and the insulative resin layer is a half-hardened pre-preg. An insulative resin layer having an epoxy resin or bismaleimidetriazine impregnated in glass fibers is used as the pre-preg. For example, GEA-67N manufactured by Hitachi Chemical Co., Ltd or GHPL-830 manufactured by Mitsubishi Gas Chemical Company Inc. is used. Thereafter, the respective pre-pregs (70, 80) and the composite substrate 75 are arranged so as to be opposed to each other in such a manner that the composite substrate 75 is held from the both sides thereof by the pair of first and second resin formed plates (74, 84).

Figure 9A:
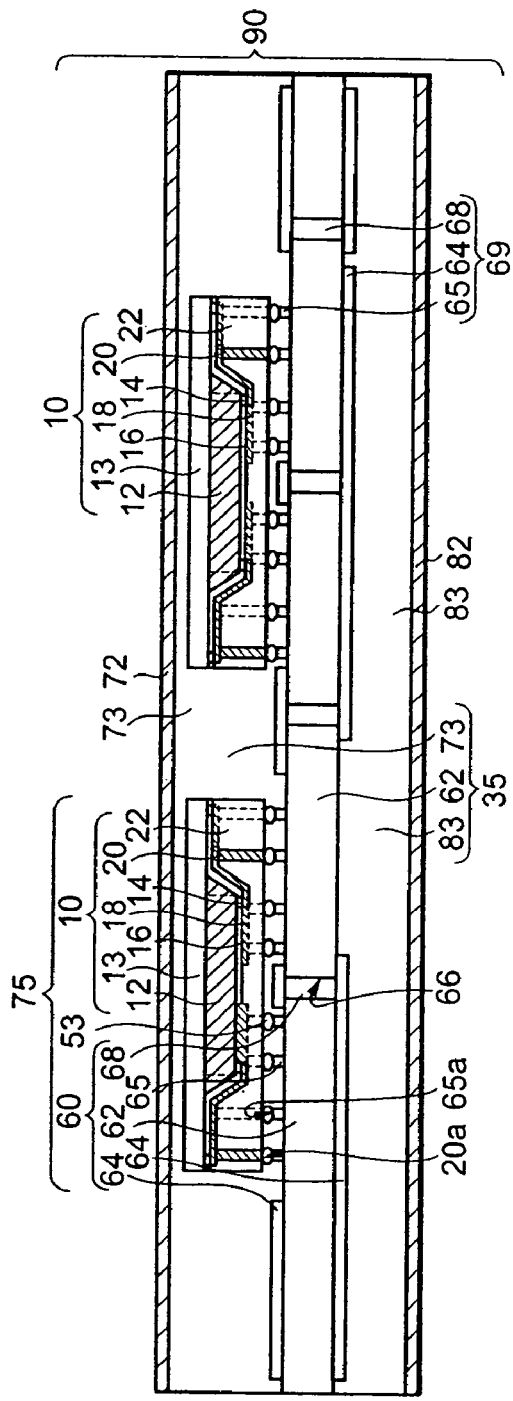
FIGS. 9A and 9B are schematic cross-sectional views (No. 3) illustrating manufacturing steps of the substrate having a built-in semiconductor apparatus according to the second embodiment of the present invention.

Subsequently, as shown in FIG. 9A, as the thrusting step, the pair of first and second resin formed plates (74, 84) are thrusted from the both sides. In this structural example, at the thrusting step, the hardened resin layer forming step which forms a hardened resin layer by heating and hardening the insulative resin layer is also carried out.

In this structural example, the pre-pregs (70, 80) are heated for 60 minutes or more at a temperature not less than 200° C. while thrusting the pair of first and second resin formed plates (74, 84) from the both sides with the composite substrate 75 being held therebetween in a pressure reduction of not more than, e.g., $5.3 \times 10^3$ Pa (approximately 40 Torr). Here, as one example, the first and second resin formed plates (74, 84) are thrusted from the both sides with approximately $4.9 \times 10$ Pa (approximately 5 kgf/cm$^2$) until the heating temperature reaches 130° C. (programming rate: approximately 3° C./min), then they are gradually thrusted so that approximately $2.9 \times 10^2$ Pa (approximately 30 kgf/cm$^2$) is obtained until the temperature reaches 200° C. In this manner, the thrusting step and the hardened resin forming step are simultaneously carried out, thereby forming a laminated body 90 in which the first and second pre-preg hardened layers (73, 83) are attached to each other with the composite substrate 75 therebetween.

Figure 9B:
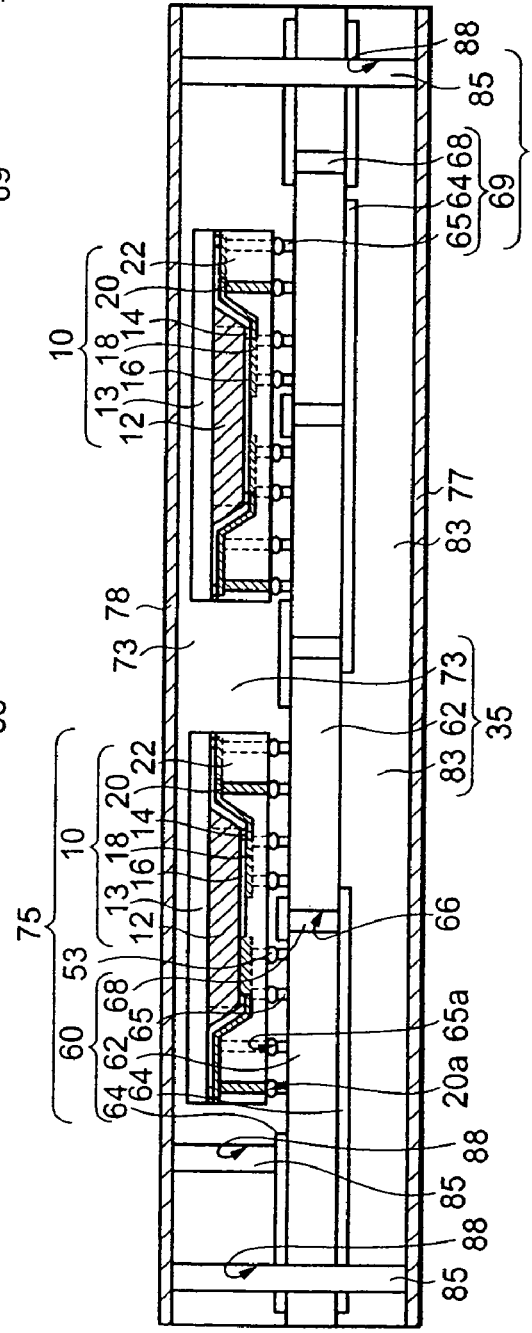

Subsequently, as shown in FIG. 9B, as the second conductive wiring forming step, there is formed a conductor portion 85 as a second conductive wiring which constitutes an substrate wiring portion 51 which electrically connects a wring 77 and a land 78 consisting of metal plates (72, 82) with a first conductive wiring 69. The conductor portion 85 is formed by, e.g., forming a through hole 88 which pierces the two sides of the laminated body 90 by using a drill and the like before forming the wiring 77 or the land 78 by patterning the copper foil on the surface of the laminated body 90, then filling copper in this through hole 88 by a plating method and the like. Thereafter, the copper foil (72, 82) on the surface of the laminated body 90 is formed by patterning on the predetermined wiring 77 and land 78 electrically connected with the conductor portion 85, then the solder ball 40 is formed on the land 78, thereby bringing the substrate having a built-in semiconductor apparatus 200 to completion (see FIG. 6). It is to be noted that any other active element or passive element can be built in the substrate having a built-in semiconductor apparatus 200 by the same method as that of the semiconductor apparatus 10. Furthermore, in this structural example, the description has been given as to the example of a four-layer structure in which the wiring substrate 60 as the composite substrate and the semiconductor apparatus 10 are sandwiched between the pair of pre-preg hardened layers (73, 83), but the layer structure can be arbitrarily preferably selected in accordance with an object or a design.

As apparent from the above explanation, according to this embodiment, the same effects as those of the first embodiment can be obtained.

Moreover, in this embodiment, since the substrate having a built-in semiconductor apparatus can be formed by the lamination method using the inexpensive pre-pregs, this embodiment is superior in the mass productivity as compared with the first embodiment using the build-up layer which leads to an increase in cost.

Additionally, since the thermal stability or the mechanical strength of the substrate having a built-in semiconductor apparatus can be improved by using the pre-pregs, the highly reliable substrate having a built-in semiconductor apparatus can be realized.

Further, in this embodiment, any other active element or passive element to be built in the substrate together with the semiconductor apparatus can be likewise arranged on the substrate having the semiconductor apparatus mounted thereon. Therefore, such an active element or passive element can be arranged in the vicinity of the semiconductor apparatus, a further improvement in the electrical characteristics of the substrate having a built-in semiconductor apparatus than that of the first embodiment can be expected.

Third Embodiment

The third embodiment according to the present invention will now be described with reference to FIGS. 10 and 11.

In this embodiment, when manufacturing the substrate having a built-in semiconductor apparatus, a main difference from the second embodiment lies in that a first resin formed plate having holes formed to the pre-preg so as to expose the part of the copper foil opposed to the substrate having built-in semiconductor apparatus is used in the resin formed plate arranging step.

In the second embodiment, of the surface of the substrate having a built-in semiconductor apparatus 200, it is often the case that the surface on the side where the semiconductor apparatus is embedded in particular is inferior in flatness and may become an irregular surface. That is because the pre-preg at the part corresponding to the semiconductor apparatus is thrusted toward any other area in the thrusting step, but the pre-preg has a lower fluidity since it contains paper or fibers and the surface of the substrate cannot be sufficiently uniformed. Thus, although methods and the like which intend to flatten the surface of the substrate by increasing a pressure used to thrust the pre-preg have been proposed, a stress orthogonal to the thrusting direction is applied to the internal semiconductor apparatus, and there is fear that the electrical connection part in the substrate may be broken.

Thus, in this embodiment, the first resin formed plate is manufactured by the following method.

Figure 10A:
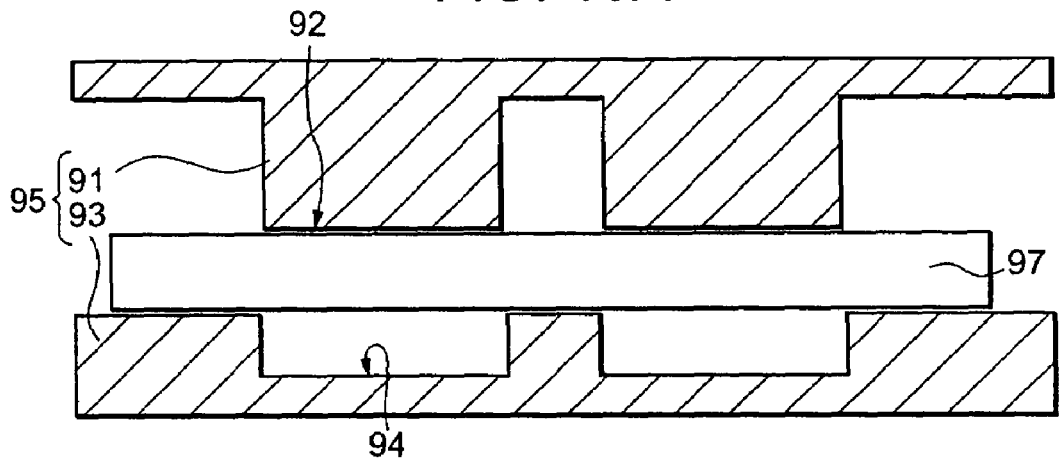
FIG. 10 is schematic cross-sectional views illustrating a manufacturing method of a substrate having a built-in semiconductor apparatus according to a third embodiment of the present invention.
Figure 10B:
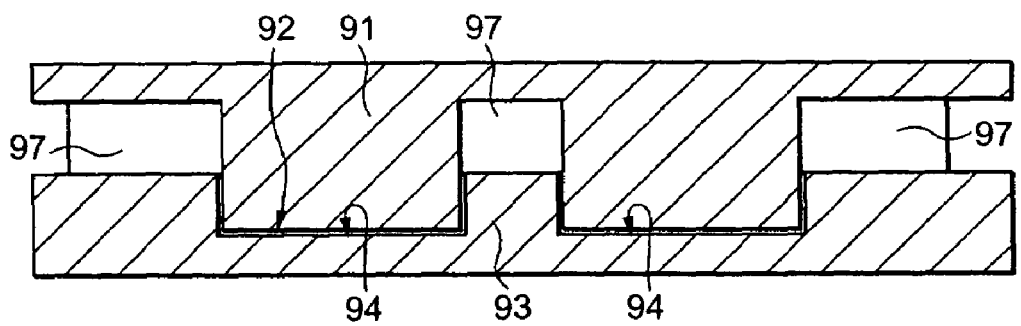
Figure 10C:
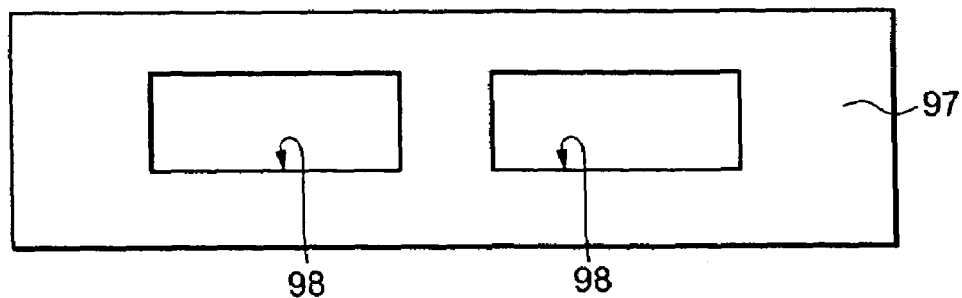
Figure 11:
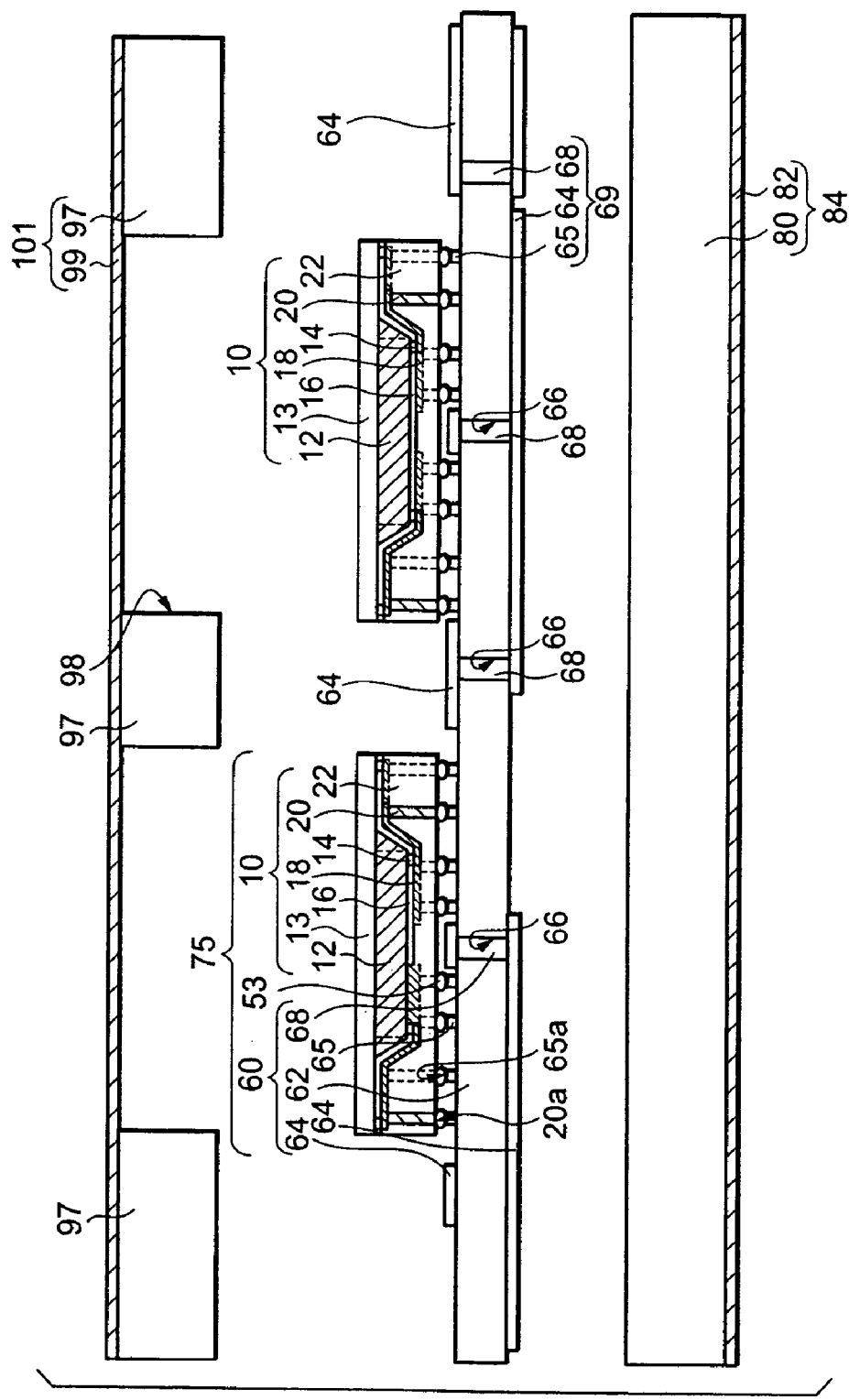
FIG. 11 is a schematic cross-sectional view illustrating the manufacturing method of the substrate having a built-in semiconductor apparatus according to the third embodiment of the present invention.

As shown in FIG. 10A, there is first prepared a die 95 including, e.g., a thrusting portion 91 which has a convex portion 92 and a receiving portion 93 which has a concave portion 94 in which the convex portion is fitted. The convex portion 92 is provided at a position corresponding to the part of the pre-preg 97 of the first resin formed plate opposed to the semiconductor apparatus when the first resin formed plate and the composite substrate are superposed. The plate-like pre-preg 97 in which an epoxy resin or bismaleimide-triazine is impregnated in glass fibers is provided between the thrusting portion 91 and the receiving portion 93 like the second embodiment. Thereafter, a load is applied between the thrusting portion 91 and the receiving portion 93 and the convex portion 92 is fitted in the concave portion 94 (FIG. 10B), thereby forming each open hole 98 in the pre-preg 97 by punching (FIG. 10). This open hole 98 is provided so as to have a position and a dimension capable of accommodating the semiconductor apparatus 10 included in the composite substrate 75 when the first resin formed plate 101 and the composite substrate 75 are superposed in the resin formed plate arranging step. Thereafter, the pre-preg 97 having each open hole 98 and the copper foil 99 as a metal plate are attached to each other by thermo compression bonding. In this manner, there is manufactured the first resin formed plate 101 that the copper foil 99 at the part corresponding to the semiconductor apparatus 10 is exposed from the open hole 98 of the pre-preg 97 in the resin formed plate arranging step (FIG. 11). It is to be noted that the method for forming the open hole 98 is not restricted to the above-described method, and an arbitrary preferred method can be selected.

Subsequently, the first resin formed plate 101 is used in place of the first resin formed plate 74 according to the second embodiment, and the steps after the resin formed plate arranging step described in connection with FIG. 8 are carried out like the second embodiment (explanation is eliminated).

As apparent from the above description, according to this embodiment, the same advantages as those of the second embodiment can be obtained.

Further, in this embodiment, since the pre-preg at the part of the first resin formed plate corresponding to the semiconductor apparatus is removed in advance, it is possible to suppress the flatness of the substrate surface from being obstructed when the pre-preg corresponding to a capacity of the semiconductor apparatus is thrusted in the thrusting step.

As a result, the flatness of the surface of the substrate having a built-in semiconductor apparatus can be improved, and the electrical characteristics of the substrate having a built-in semiconductor apparatus can be assuredly obtained.

Fourth Embodiment

Figure 12:
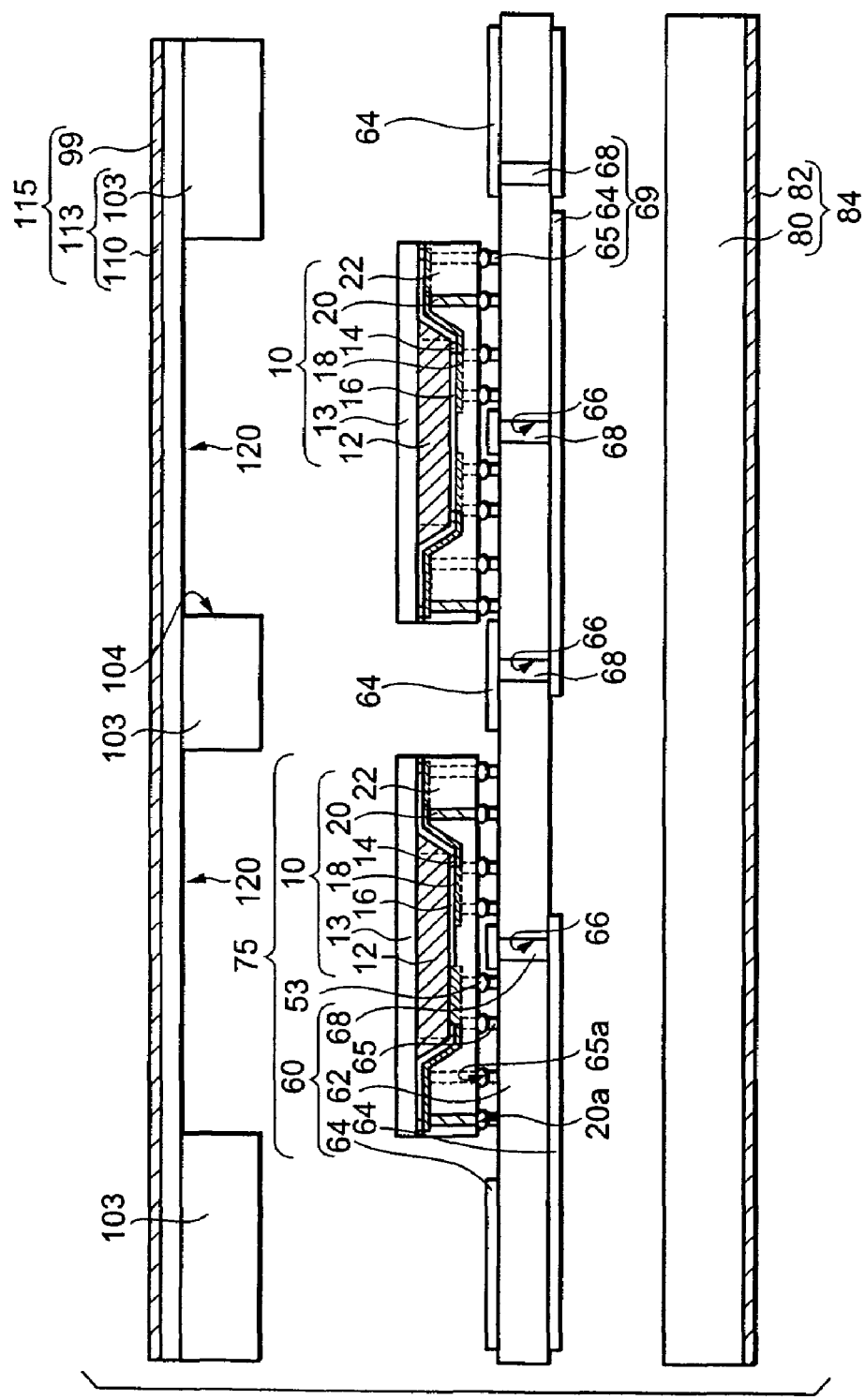
FIG. 12 is a schematic cross-sectional view illustrating a manufacturing method of a substrate having a built-in semiconductor apparatus according to a fourth embodiment of the present invention.

The fourth embodiment according to the present invention will now be described with reference to FIG. 12.

In this embodiment, in case of manufacturing the substrate having a built-in semiconductor apparatus, a main difference from the third embodiment lies in that the resin formed plate arranging step uses the first resin formed plate having a concave portion formed at the part of the pre-preg of the first resin formed plate which corresponds to the semiconductor apparatus when the first resin formed plate and the composite substrate are superposed.

The first resin formed plate according to the third embodiment has a structure that the copper foil at the part corresponding to the semiconductor apparatus is exposed. Therefore, a thickness of the pre-preg filled between the rear surface of the semiconductor apparatus of the completed substrate having a built-in semiconductor apparatus and the copper foil 99 is very small, and there is fear that a short circuit may occur between these members.

Thus, in this embodiment, the first resin formed plate is manufactured by the following method.

For example, each pre-preg 103 as a first insulative resin layer is first punched to form an open hole 104 by using the die 95 (see FIG. 10A) described in connection with the third embodiment. This open hole 104 is provided so as to have a position and a dimension capable of accommodating the semiconductor apparatus 10 included in a composite substrate when a first resin formed plate 115 and the composite substrate 75 are superposed in the resin formed plate arranging step. Thereafter, a plate-like pre-preg 110 as a second insulative resin layer is sandwiched between the pre-preg 103 having the open hole 104 and a copper foil, and thermo compression bonding is carried out. In this structural example, the pre-preg 103 has a thickness substantially equal to that of the semiconductor apparatus 10, and the pre-preg 110 is adjusted and formed in such a manner that a total thickness of a laminated pre-preg 113 (103, 110) is a predetermined thickness. In this manner, in the resin formed plate arranging step, there is manufactured a first resin formed plate 115 in which the pre-preg at the part corresponding to the semiconductor apparatus is exposed from the open hole 104 of the pre-preg 103, namely, in which a concave portion 120 is formed with respect to the pre-preg 113 (FIG. 12).

Thereafter, this first resin formed plate 115 is used in place of the first resin formed plate 74 according to the second embodiment, and the steps after the resin formed plate arranging step described in connection with FIG. 8 are carried out like the second embodiment (explanation is eliminated).

As apparent from the above description, according to this embodiment, the same advantages as those of the third embodiment can be obtained.

Further, according to this embodiment, since the pre-preg is filled between the rear surface of the semiconductor apparatus of the substrate having a built-in semiconductor apparatus and the copper foil 99 so as to provide a film thickness which does not obstruct the flatness of the substrate surface, a short circuit between the both members can be effectively suppressed.

Furthermore, according to this embodiment, since the pre-preg is formed between the rear surface of the semiconductor apparatus of the substrate having a built-in semiconductor apparatus and the copper foil 99 in advance, a pressure at the time of thrusting or a heating temperature can be reduced as compared with the third embodiment.

Moreover, since the plate-like pre-preg as the second insulative resin layer is additionally provided to the first resin formed plate, a thickness of the first resin formed plate can be adjusted in accordance with a thickness of the substrate having a built-in semiconductor apparatus. Additionally, in this case, the flatness of the surface of the substrate having a built-in semiconductor apparatus can be improved by the concave portion formed to the pre-preg.

Fifth Embodiment

The fifth embodiment according to the present invention will now be described with reference to FIG. 13.

In this embodiment, a main difference from the fourth embodiment lies in that a first resin formed plate having a concave portion formed relative to a single-layer pre-preg is used in the resin formed plate arranging step when manufacturing the substrate having a built-in semiconductor apparatus.

Thus, in this embodiment, the first resin formed plate is manufactured by any of the following methods.

Figure 13A:
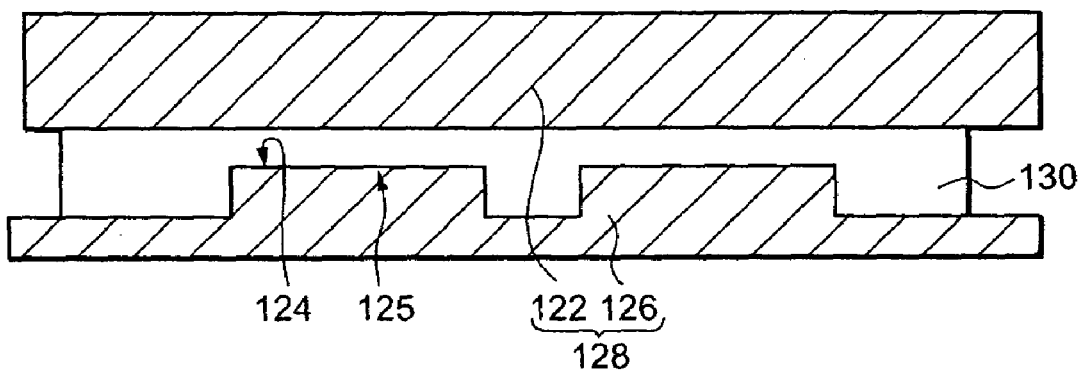
FIG. 13 is schematic cross-sectional views illustrating a manufacturing method of a substrate having a built-in semiconductor apparatus according to a fifth embodiment of the present invention.
Figure 13B:
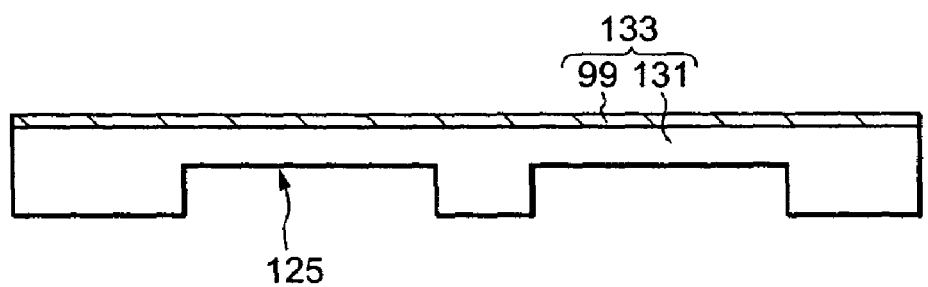

As shown in FIG. 13A, in the first method, there is prepared a die 128 consisting of a tabular upper die 122 and a lower die 126 having a convex portion 124. The convex portion 124 is provided at a position corresponding to the part of the pre-preg which is opposed to the semiconductor apparatus when the first resin formed plate and a composite substrate are superposed in the resin formed plate arranging step. After supplying an unhardened pre-preg 130 between the upper die 122 and the lower die 126, these dies are heated for five minutes at 120° C. while applying a load (e.g., 9.8×10 Pa (approximately 10 kgf/cm²)) between the upper die 122 and the lower die 126, so that the pre-preg is half-hardened. It is to be noted that the pre-preg 103 is a pre-preg having an epoxy resin, bismaleimidetriazine or the like impregnated in glass fibers. Thereafter, a half-hardened pre-preg 131 having a concave portion 125 formed at a part corresponding to the semiconductor apparatus is attached to the copper foil 99 by thermo compression bonding, thereby manufacturing a first resin formed plate 133 (FIG. 13B).

In the second method, after providing the already half-hardened pre-preg 131 between the upper die 122 and the lower die 126, this pre-preg is held at a temperature not less than 150° C. while applying a load (e.g., 9.8×10 Pa (approximately 10 kgf/cm²)) between the upper die 122 and the lower die 126, thereby obtaining a half-hardened pre-preg having a concave portion 125 formed thereto. In this manner, like the first method, the pre-preg is attached onto the copper foil 99, thus manufacturing the first resin formed plate 133 (see FIG. 13B).

Figure 13C:
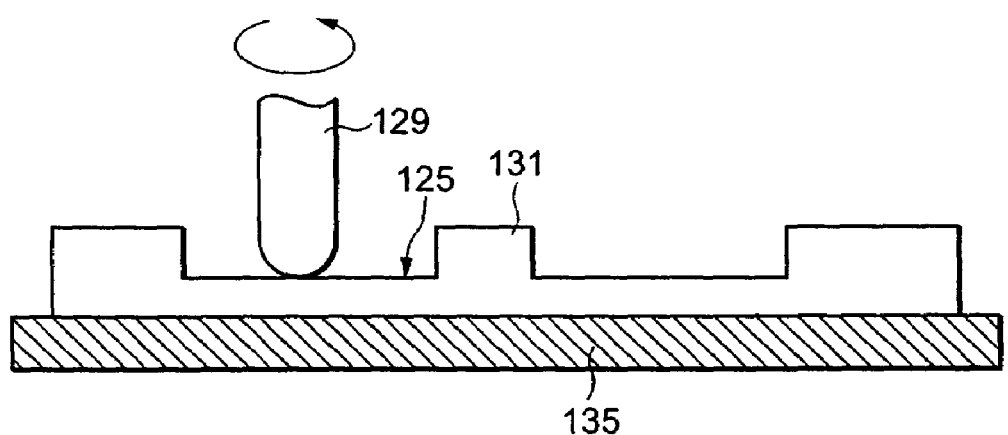

The third method forms a concave portion 125 to the half-hardened pre-preg 131 supported by a support portion 135 by using cutting means 129 such as a rotary blade (FIG. 13C). Thereafter, the pre-preg 131 peeled from the support portion 135 is attached onto the copper foil 99 like the first method, thereby manufacturing the first resin formed plate 133 (see FIG. 13B).

Then, this first resin formed plate 133 is used in place of the first resin formed plate 74 according to the second embodiment, and the steps after the resin formed plate arranging step described with reference to FIG. 8 are carried out like the second embodiment (explanation is eliminated).

As apparent from the above description, according to this embodiment, the same advantages as those of the fourth embodiment can be obtained.

Further, according to this embodiment, since the concave portion is formed with respect to the single-layer pre-preg, production of the first resin formed plate becomes easier than that of the fourth embodiment. Therefore, a product cost per substrate having a built-in semiconductor apparatus can be reduced.

Sixth Embodiment

The sixth embodiment according to the present invention will now be described with reference to FIG. 14.

In this embodiment, a main difference from the second embodiment lies in that the pre-preg is not used but a first resin formed plate 145 to which a thermosetting resin 140 containing no glass fiber is formed is alternatively used on a metal plate 99 in the resin formed plate arranging step when manufacturing the substrate having a built-in semiconductor apparatus.

Figure 14:
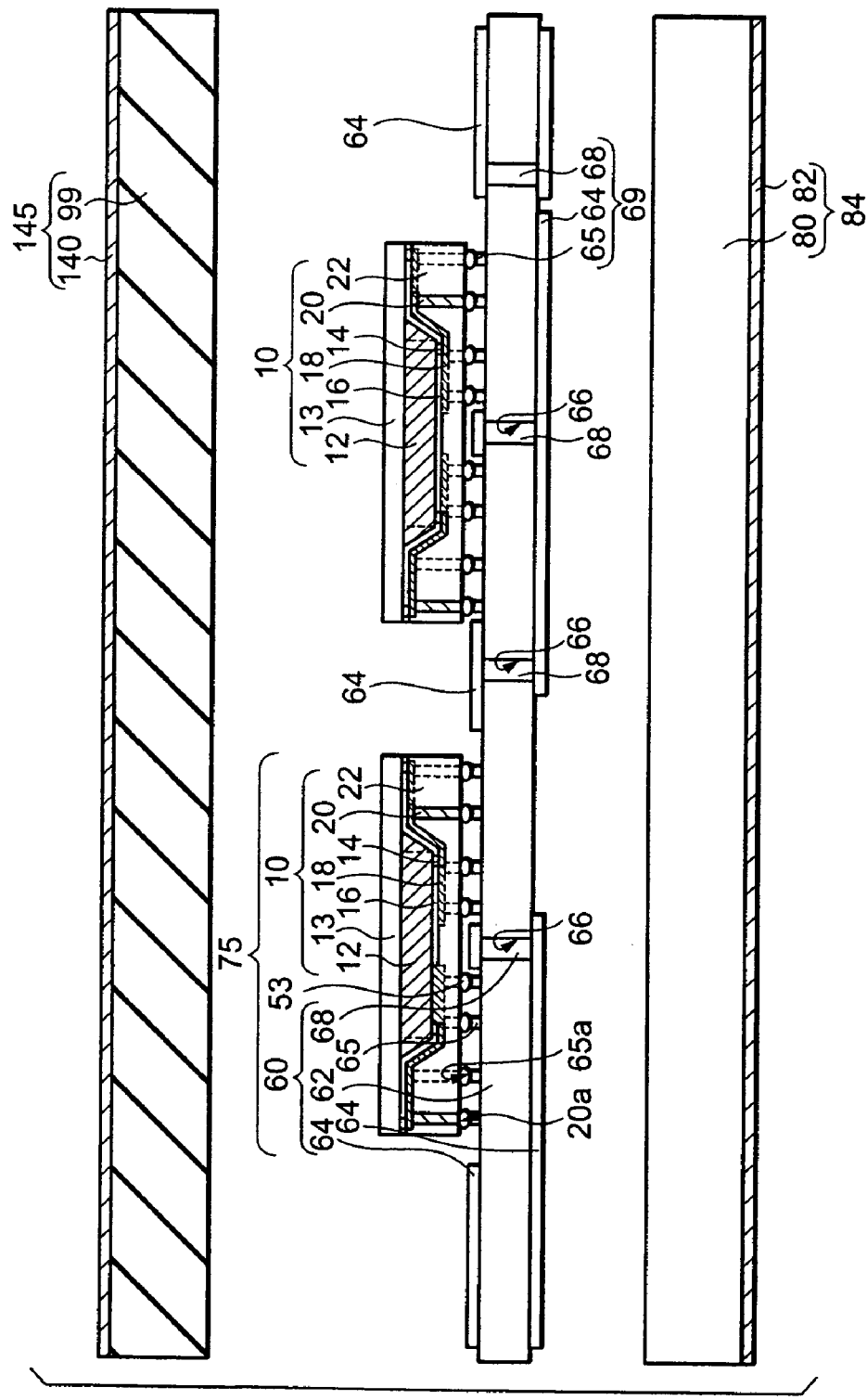
FIG. 14 is a schematic cross-sectional view illustrating a manufacturing method of a substrate having a built-in semiconductor apparatus according to a sixth embodiment of the present invention.

That is, as shown in FIG. 14, a copper foil 99 and a plate-like thermosetting resin 140 such as an epoxy resin or bismaleimidetriazine are attached by thermo compression bonding, thereby manufacturing a first resin formed plate 145.

Thereafter, the first resin formed plate 145 is used in place of the first resin formed plate 74 according to the second embodiment, and the steps after the resin formed plate arranging step described with reference to FIG. 8 are carried out like the second embodiment (explanation is eliminated).

As apparent from the above explanation, according to this embodiment, the same advantages as those of the second embodiment can be obtained.

Furthermore, according to this embodiment, the fluidity of the resin can be improved as compared with the second embodiment. As a result, a gap between the semiconductor apparatus 10 and the wiring substrate 60 can be readily sealed by using this resin, and hence an under-filling step is no longer necessary. Thus, a production cost per substrate having a built-in semiconductor apparatus can be reduced.

Seventh Embodiment

Figure 15:
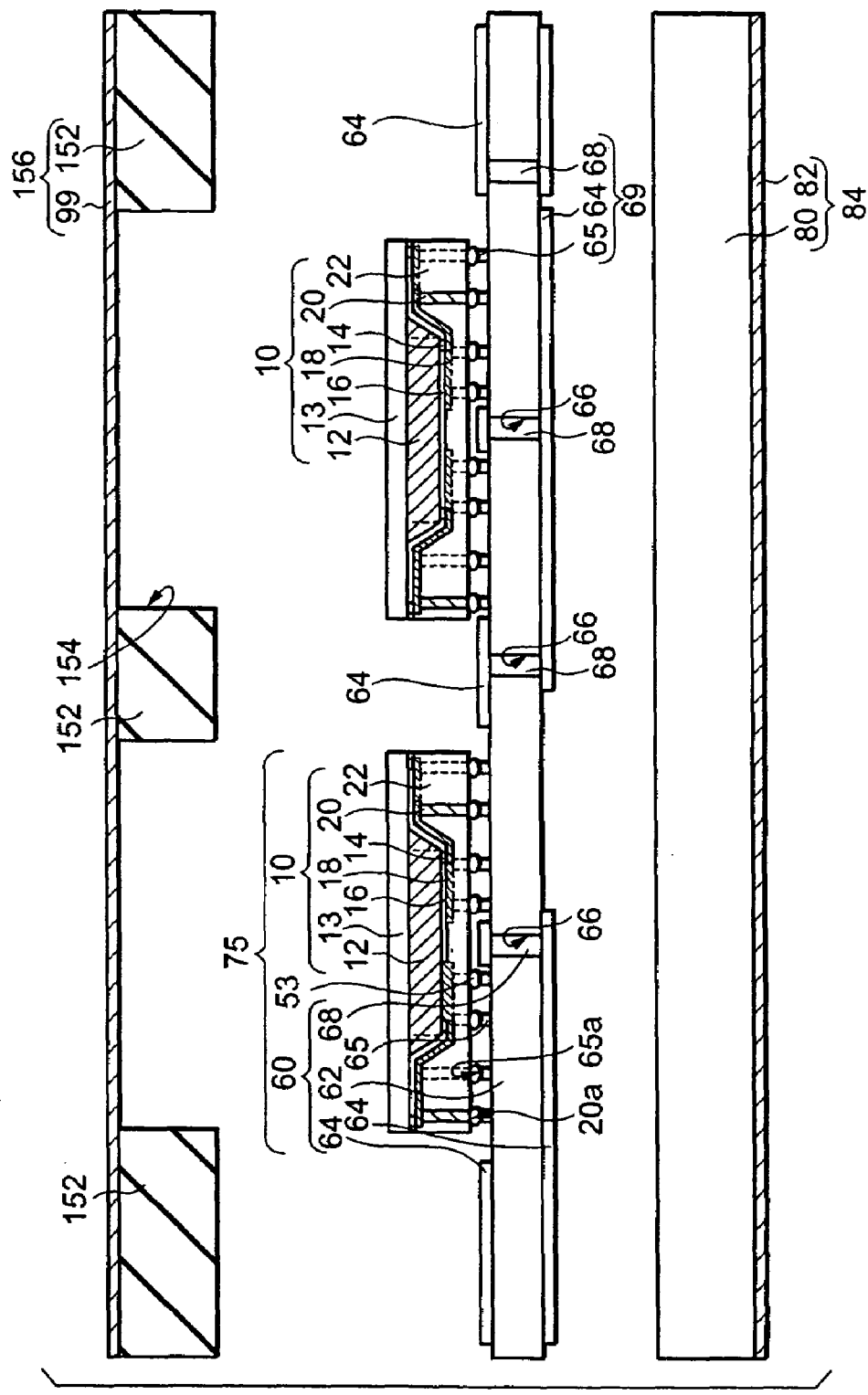
FIG. 15 is a schematic cross-sectional view illustrating a manufacturing method of a substrate having a built-in semiconductor apparatus according to a seventh embodiment of the present invention.

The seventh embodiment according to the present invention will now be described with reference to FIG. 15.

In this embodiment, a main difference from the sixth embodiment lies in that a first resin formed plate 156 having an open hole 154 formed to a thermosetting resin 152 is used in such a manner that the part of a copper foil 99 which is opposed to the substrate having a built-in semiconductor apparatus is exposed in the resin formed plate arranging step when manufacturing the substrate having a built-in semiconductor apparatus.

Thus, in this embodiment, the first resin formed plate is manufactured by the following method.

First, for example, a thermosetting resin 152 is punched to form an open hole 154 by using the die 95 (see FIG. 10) described in connection with the third embodiment. This open hole 154 is provided so as to have a position and a dimension capable of accommodating the semiconductor apparatus 10 constituting a composite substrate 75 when the thermosetting resin 152 and the composite substrate 75 are superposed. Then, the thermosetting resin 152 having the open hole 154 and a copper foil 99 are attached to each other by thermo compression bonding. In this manner, there is manufactured a first resin formed plate 156 in which the copper foil 99 at the part corresponding to the semiconductor apparatus 10 is exposed from the open hole 154 of the thermosetting resin 152 in the resin formed plate arranging step (FIG. 15).

Thereafter, this first resin formed plate 156 is used in place of the first resin formed plate 74 according to the second embodiment, and the steps after the resin formed plate arranging step described with reference to FIG. 8 are carried out like the second embodiment (explanation is eliminated).

As apparent from the above explanation, according to this embodiment, the same advantages as those of the sixth embodiment can be obtained.

Moreover, in this embodiment, since the thermosetting resin at the part of the first resin formed plate corresponding to the semiconductor apparatus is removed in advance, the thermosetting resin corresponding to a capacity of the semiconductor apparatus is thrusted in the thrusting step, thereby suppressing the flatness of the substrate surface from being obstructed. As a result, the flatness of the surface of the substrate having a built-in semiconductor apparatus can be improved.

Eighth Embodiment

Figure 16:
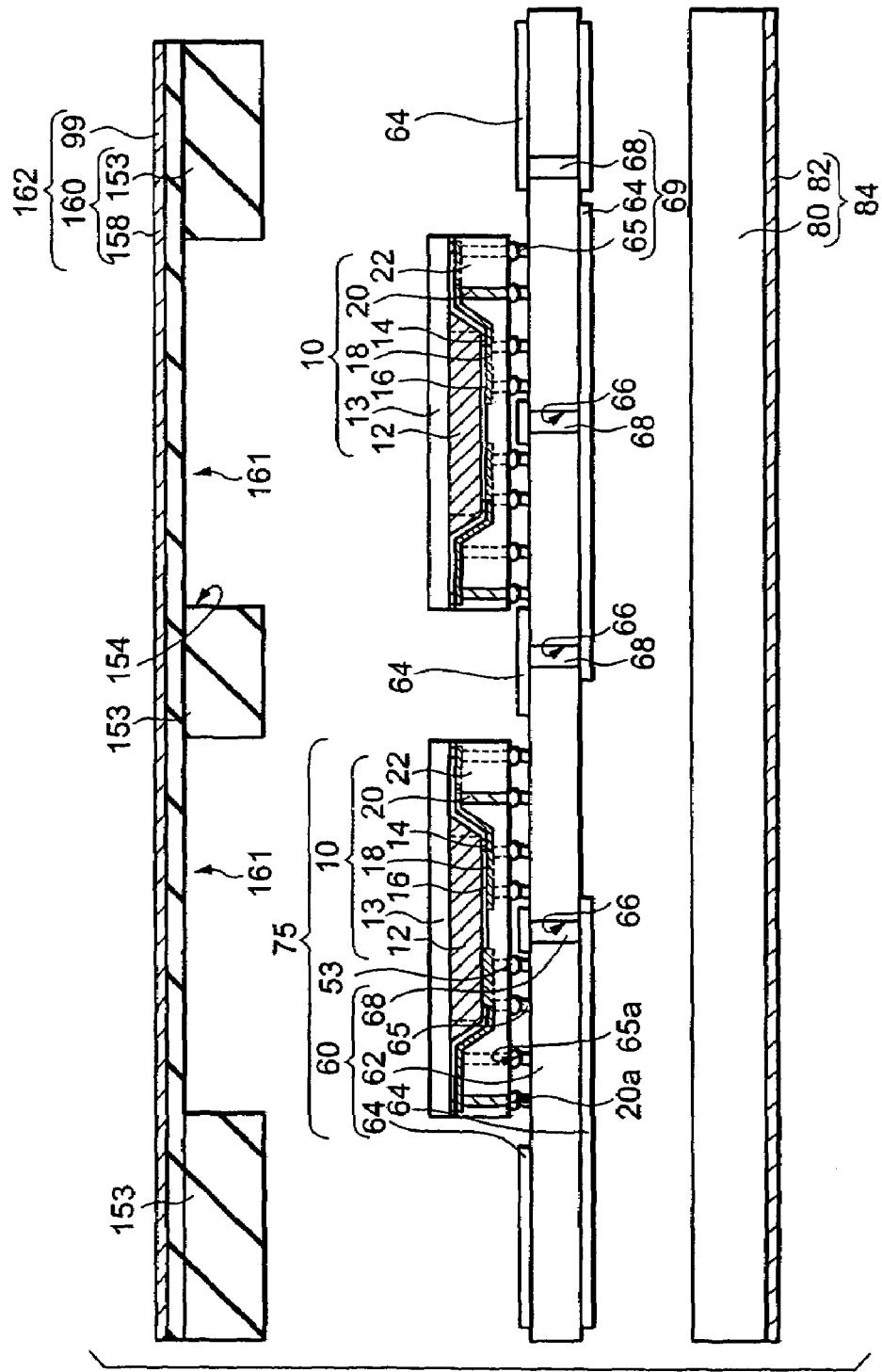
FIG. 16 is a schematic cross-sectional view illustrating a manufacturing method of a substrate having a built-in semiconductor apparatus according to an eighth embodiment of the present invention.

The eighth embodiment according to the present invention will now be described with reference to FIG. 16.

In this embodiment, a main difference from the seventh embodiment lies in that the resin formed plate arranging step uses a first resin formed plate in which a concave portion is formed at a part of a thermosetting resin included in the first resin formed plate which corresponds to the semiconductor apparatus when the first resin formed plate and a composite substrate are superposed when manufacturing the substrate having a built-in semiconductor apparatus.

Thus, in this embodiment, the first resin formed plate is manufactured by the following method.

First, for example, a thermosetting resin 153 as a first insulative resin layer is punched to form an open hole 155 by using the die 95 (see FIG. 10A) described in connection with the third embodiment. This open hole 155 is provided so as to have a position and a dimension enabling accommodation of the semiconductor apparatus 10 included in a composite substrate 75 when a first resin formed plate 162 and the composite substrate 75 are superposed in the resin formed plate arranging step. Thereafter, a plate-like thermosetting resin 158 as a second insulative resin layer is sandwiched between the thermosetting resin 153 having the open hole 155 and the copper foil 99, and thermo compression bonding is carried out. In this structural example, the thermosetting resin 153 has a thickness substantially equal to that of the semiconductor apparatus 10, and the thermosetting resin 158 is adjusted and formed in such a manner that a total thickness of a laminated thermosetting resin 160 becomes a predetermined thickness. In this manner, there is produced the first resin formed plate 162 in which the thermosetting resin 158 at the part corresponding to the semiconductor apparatus is exposed from the open hole 155 of the thermosetting resin 153, namely, in which a concave portion 161 is formed with respect to the laminated thermosetting resin 160 (153, 158) in the resin formed plate arranging step (FIG. 16).

Thereafter, this first resin formed plate 162 is used in place of the first resin formed plate 74 according to the second embodiment, and the steps after the resin formed plate arranging step described with reference to FIG. 8 are carried out like the second embodiment (explanation is eliminated).

As apparent from the above description, according to this embodiment, the same advantages as those of the seventh embodiment can be obtained.

Moreover, according to this embodiment, since the thermosetting resin is filled between the rear surface of the semiconductor apparatus of the substrate having a built-in semiconductor apparatus and the copper foil 99 so as to have a film thickness which does not obstruct the flatness of the substrate surface, a short circuit between the both members can be effectively suppressed.

Additionally, according to this embodiment, since the thermosetting resin is formed between the rear surface of the semiconductor apparatus of the substrate having a built-in semiconductor apparatus and the copper foil 99 in advance, a pressure at the time of thrusting or a heating temperature can be further reduced as compared with the seventh embodiment.

Further, since the plate-like thermosetting resin as the second insulative resin layer is additionally provided to the first resin formed plate, a thickness of the first resin formed plate can be adjusted in accordance with a thickness of the substrate having a built-in semiconductor apparatus. Furthermore, in this case, the concave portion formed to the thermosetting resin can improve the flatness of the surface of the substrate having a built-in semiconductor apparatus.

Ninth Embodiment

Figure 17:
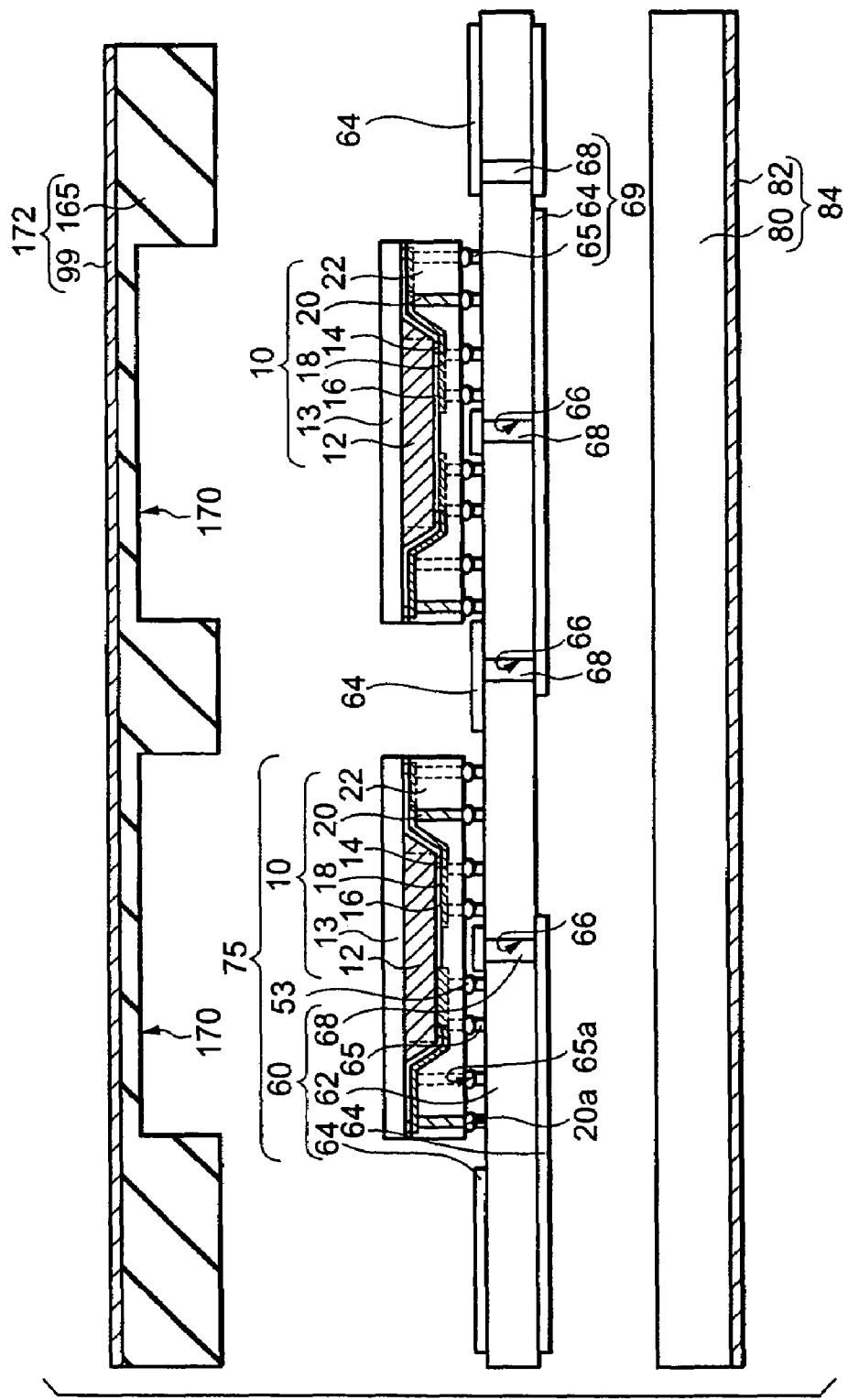
FIG. 17 is a schematic cross-sectional view illustrating a manufacturing method of a substrate having a built-in semiconductor apparatus according to a ninth embodiment of the present invention.

The ninth embodiment according to the present invention will now be described with reference to FIG. 17.

In this embodiment, a main difference from the eighth embodiment lies in that a first resin formed plate having a concave portion formed relative to a single-layer thermosetting resin is used in the resin formed plate arranging step when manufacturing a substrate having a built-in semiconductor apparatus.

Thus, in this embodiment, in regard to a first resin formed plate, a half-hardened thermosetting resin 165 having a concave portion 170 formed at a part corresponding to the semiconductor apparatus is formed by using, e.g., a die 128 or cutting means 129 described in connection with the fifth embodiment (see FIGS. 13A and 13C). Then, the thermosetting resin 165 having the concave portion 170 and the copper foil 99 are attached by thermo compression bonding, thereby manufacturing a first resin formed plate 172 (FIG. 17).

Thereafter, this first resin formed plate 172 is used in place of the first resin formed plate 74 according to the second embodiment, and the steps after the resin formed plate arranging step described with reference to FIG. 8 are carried out like the second embodiment (explanation is eliminated).

As apparent from the above description, according to the present invention, the same advantages as those of the eighth embodiment can be obtained.

Furthermore, according to this embodiment, since the concave portion is formed with respect to the single-layer thermosetting resin, production of the first resin formed plate can be facilitated as compared with the eighth embodiment. Therefore, a production cost per substrate having a built-in semiconductor apparatus.

10th Embodiment

The 10th embodiment according to the present invention will now be described with reference to FIG. 18.

In this embodiment, a main difference from the sixth embodiment lies in that a first resin formed plate 178 in which a plate-like pre-preg 174 with a predetermined width is interposed between a metal plate 99 and a plate-like thermosetting resin 176 is used in the resin formed plate arranging step when manufacturing the substrate having a built-in semiconductor apparatus.

Figure 18:
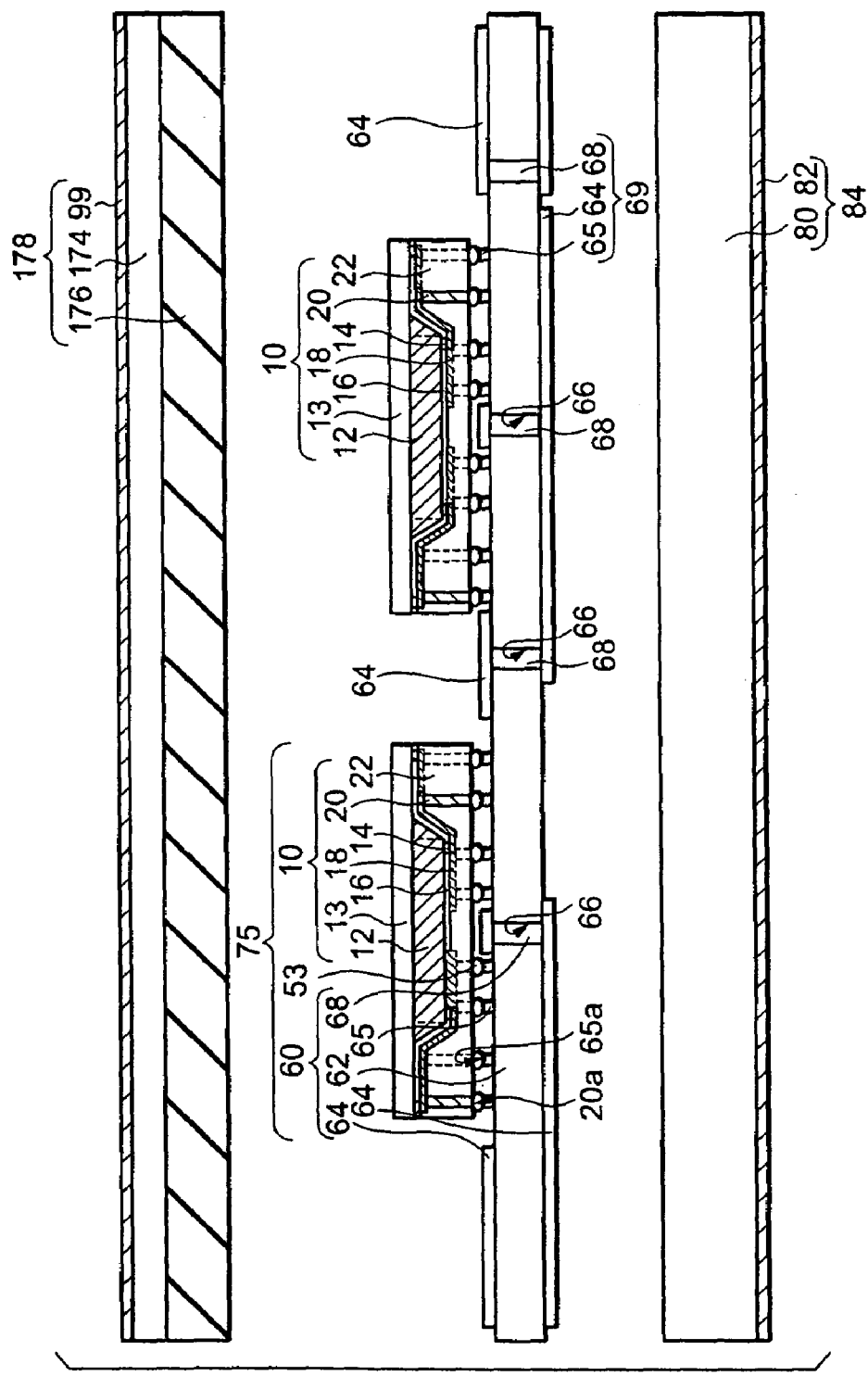
FIG. 18 is a schematic cross-sectional view illustrating a manufacturing method of a substrate having a built-in semiconductor apparatus according to a 10th embodiment of the present invention.

That is, as shown in FIG. 18, in the first resin formed plate 178 according to this embodiment, the copper foil 99, the pre-preg 174 and the thermosetting resin 176 are sequentially attached by thermo compression bonding.

Thereafter, this first resin formed plate 178 is used in place of the first resin formed plate 74 according to the second embodiment, and the step after the resin formed plate arranging step described with reference to FIG. 8 are carried out like the second embodiment (explanation is eliminated).

As apparent from the above description, according to this embodiment, the same advantages as those of the sixth embodiment can be obtained.

Furthermore, in this embodiment, an insulative member mainly containing a pre-preg can be assuredly retained between a rear surface of the semiconductor apparatus of the completed substrate having a built-in semiconductor apparatus and the copper foil 99 by using the pre-preg which is formed with a predetermined thickness on the copper foil of the first resin formed plate and has the lower fluidity. Therefore, a short circuit between these members can be further effectively suppressed.

11th Embodiment

Figure 19:
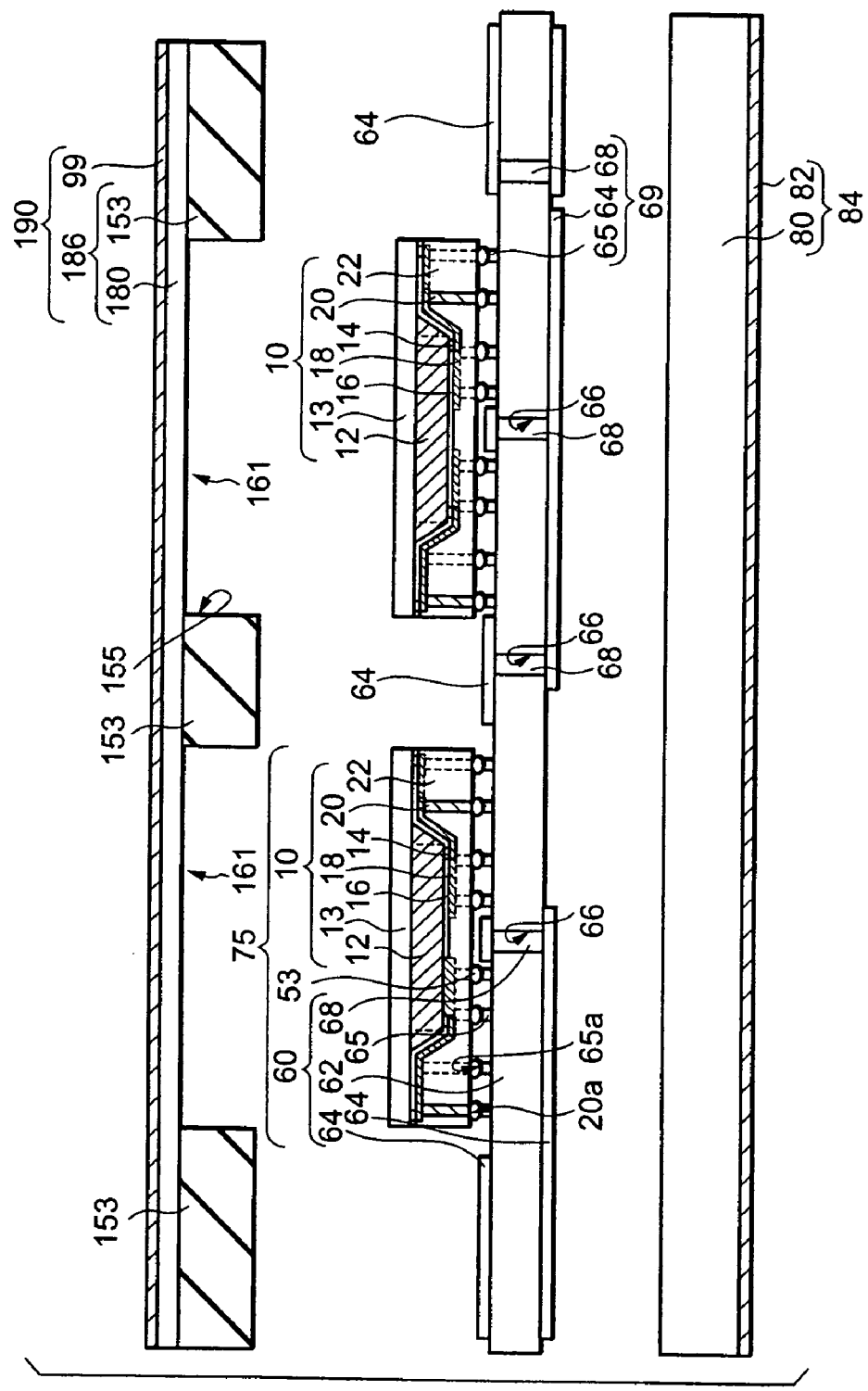
FIG. 19 is a schematic cross-sectional view illustrating a manufacturing method of a substrate having a built-in semiconductor apparatus according to an 11th embodiment of the present invention.

The 11th embodiment according to the present invention will now be described with reference to FIG. 19.

In this embodiment, a main difference from the eighth embodiment lies in that the resin formed plate arranging step uses a first resin formed plate formed as a second insulating resin layer formed by using a pre-preg in place of a thermosetting resin when manufacturing the substrate having a built-in semiconductor apparatus.

Thus, in this embodiment, a first resin formed plate is manufactured by the following method.

That is, in this embodiment, a plate-like pre-preg 180 as a second insulative resin layer is sandwiched between a thermosetting resin 153 having an open hole 155 described in connection with the eighth embodiment and a copper foil 99, and thermo compression bonding is carried out. In this structural example, the pre-preg 180 is adjusted and formed in such a manner that a total thickness of a laminated insulative resin 180 (153, 180) becomes a predetermined thickness. In this manner, there is manufactured a first resin formed plate 190 in which the pre-preg 180 at the part corresponding to the semiconductor apparatus is exposed from the open hole 155 of the thermo setting resin 153, i.e., in which the concave portion 161 is formed to the laminated insulative resin 186 (153, 180) (FIG. 19).

Subsequently, this first resin formed plate 190 is used in place of the first resin formed plate 74 according to the second embodiment, and the steps after the resin formed plate arranging step described with reference to FIG. 8 are carried out like the second embodiment (explanation is eliminated).

As apparent from the above description, according to this embodiment, the same advantages as those of the eighth embodiment can be obtained.

Moreover, in this embodiment, an insulative member mainly containing a pre-preg can be assuredly retained between a rear surface of the semiconductor apparatus of the completed substrate having a built-in semiconductor apparatus and the copper foil 99 by using the pre-preg which is formed with a predetermined thickness on the copper foil of the first resin formed plate and has the lower fluidity. Therefore, a short circuit between these members can be further effectively suppressed.

12th Embodiment

The 12th embodiment according to the present invention will now be described with reference to FIG. 20.

In this embodiment, a main difference from the third embodiment lies in that a spacer 195 with a predetermined thickness is formed on a wiring substrate 60 in such a manner that a percentage of an area facing a first resin formed plate and a percentage of an area not facing the first resin formed plate in the wiring substrate 60 become substantially equal to each other in the resin formed plate arranging step when manufacturing the substrate having a built-in semiconductor apparatus.

Figure 20:
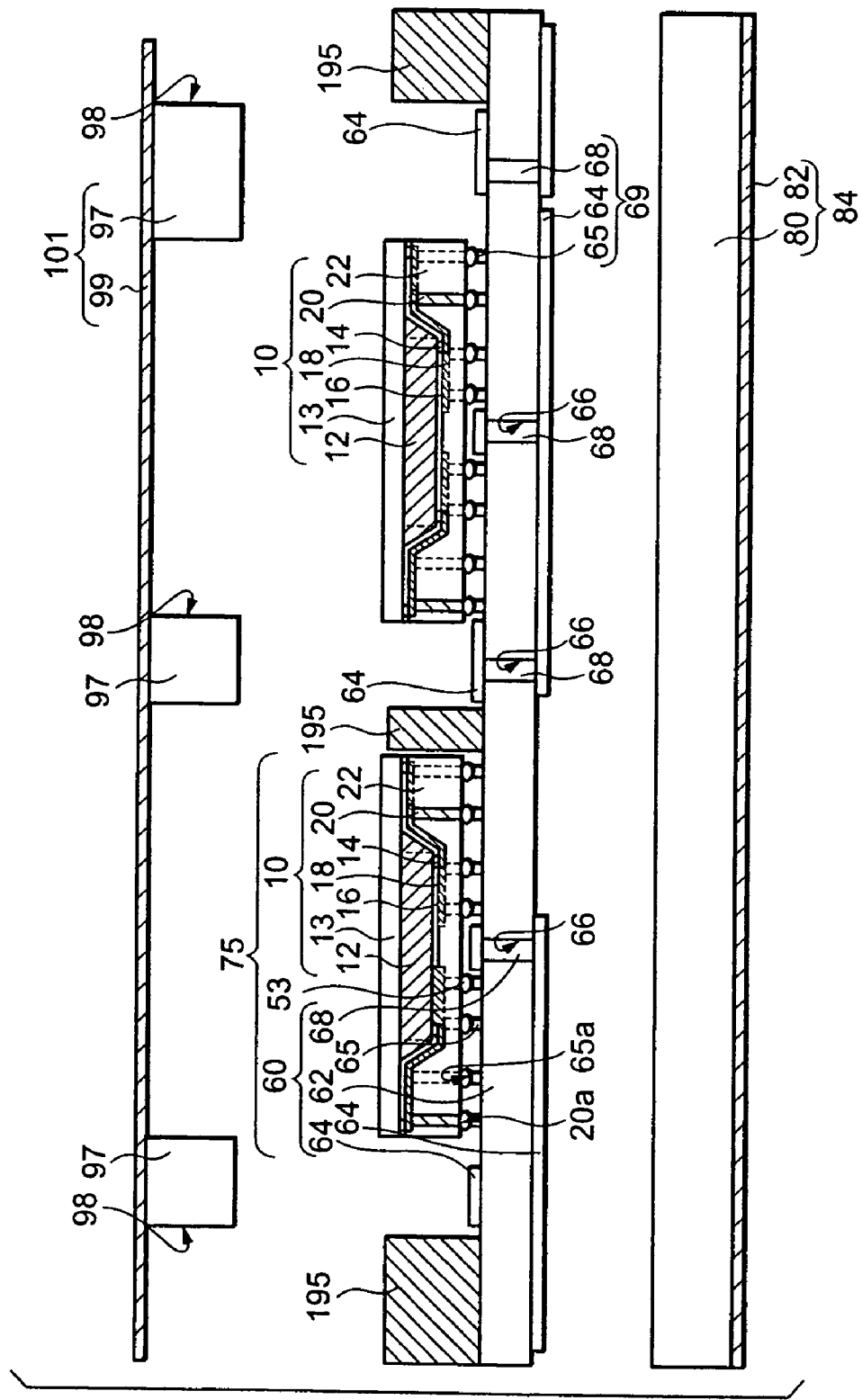
FIG. 20 is a schematic cross-sectional view illustrating a manufacturing method of a substrate having a built-in semiconductor apparatus according to a 12th embodiment of the present invention.

That is, as shown in FIG. 20, a spacer 195 with a predetermined thickness which consists of a material different from a pre-preg is formed on a wiring substrate 60 in such a manner that a percentage of an area facing a first resin formed plate 101 becomes substantially equal to a percentage of an area not facing the first resin formed plate 101. It is to be note that this example includes a case that a percentage of the area facing the first resin formed plate becomes equal to that of the area not facing the first resin formed plate as well as a range which can obtain the same advantage as that of the case that these percentages are equal.

Then, with formation of the space 195, the above-described open hole or concave portion is likewise formed to a part corresponding to the semiconductor apparatus as well as a part corresponding to the spacer. Incidentally, it is preferable to form a thickness of the spacer 195 to be substantially equal to that of the semiconductor apparatus taking a difference in hardening shrinkage occurring in a thickness direction of the pre-preg when hardening the pre-preg into consideration.

Additionally, arbitrary preferred insulating processing or the like may be applied on the surface of the spacer 195 according to needs.

As apparent from the above description, according to this embodiment, the same advantages as those of the third embodiment can be obtained.

Further, according to this embodiment, it is possible to ease irregularities in hardening shrinkage in the thickness direction of the pre-preg which occurs in each area on the wiring substrate. Therefore, the flatness of the surface of the substrate having a built-in semiconductor apparatus can be further improved.

It is to be noted that this embodiment can be likewise applied to the above-described fourth to 11th embodiments.

13th Embodiment

The 13th embodiment according to the present invention will now be described with reference to FIG. 21.

In this embodiment, a main difference from the first embodiment lies in that a substrate having a built-in semiconductor apparatus 400 is constituted by using a wiring substrate 300 having wiring portions 304 formed on both surfaces and between both surfaces of an insulating layer in place of a pre-preg hardened layer 32.

Figure 21:
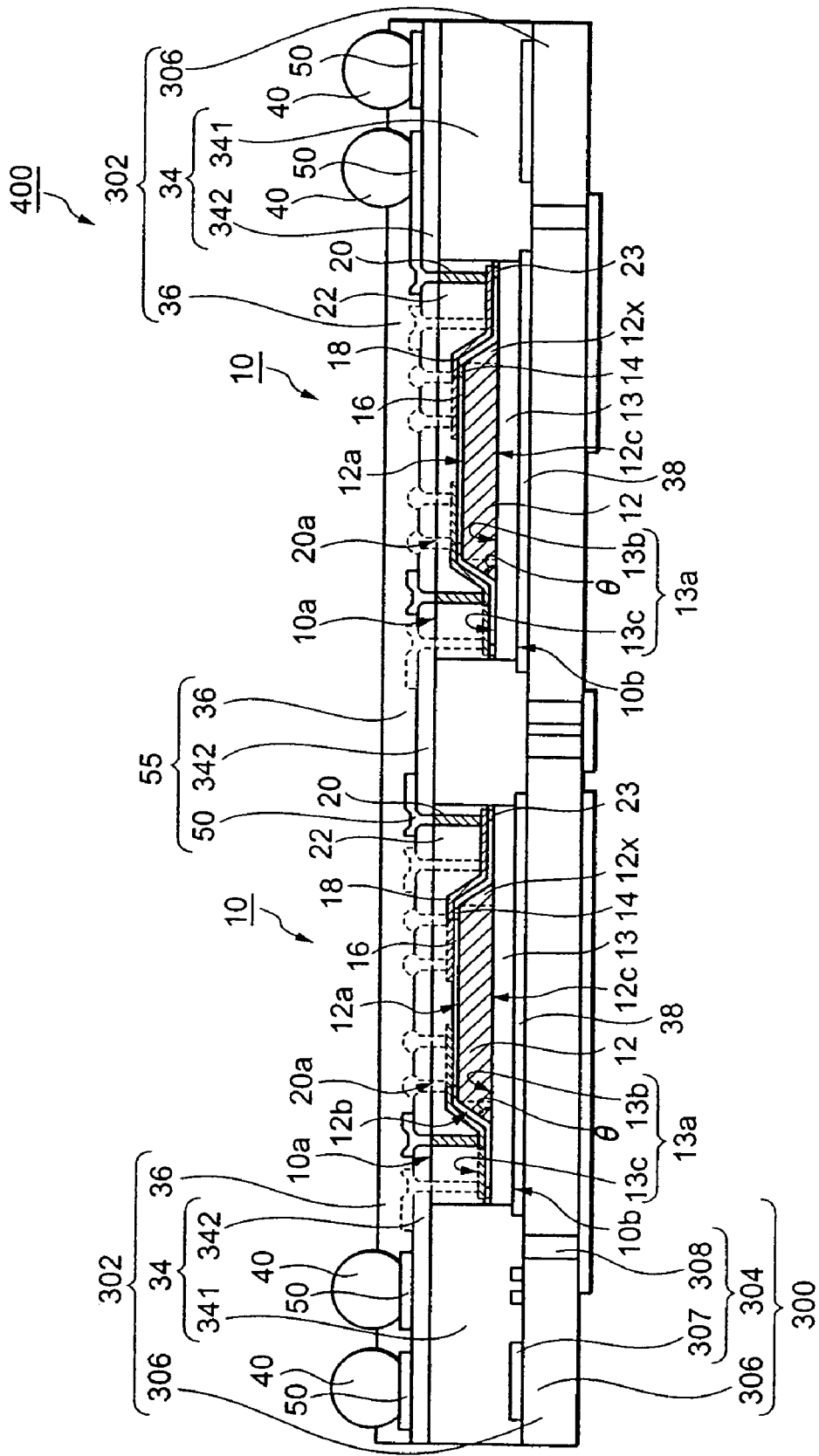
FIG. 21 is a schematic cross-sectional view illustrating a substrate having a built-in semiconductor apparatus according to a 13th embodiment of the present invention.

Specifically, as shown in FIG. 21, the semiconductor apparatus 10 is mounted and fixed on the wiring substrate 300 through a die bonding agent 38. The wiring substrate 300 in this example includes a glass epoxy base material 306 which is one member in an insulating layer 302, a wiring 307 based on copper foils formed on both surfaces of the glass epoxy base material 306, and a conductor portion 308 which electrically connects the both surfaces. The wiring 307 and the conductor portion 308 constitute a wiring portion 304.

Further, such a substrate having a built-in semiconductor apparatus 400 can be manufactured by fixing the semiconductor apparatus 10 on the wiring substrate 300 having the above-described structure through a die bonding agent 38 in the semiconductor apparatus fixing step mentioned in connection with the first embodiment. Incidentally, building any other active element or passive element in the substrate having a built-in semiconductor apparatus 400 can be performed by the same method as that of the semiconductor apparatus.

As apparent from the above description, according to this embodiment, the same advantages as those of the first embodiment can be obtained.

Furthermore, according to this embodiment, the higher-density wiring than that in the first embodiment can be expected because of the laminated structure having the semiconductor apparatus mounted on the wiring substrate. Moreover, the number of lamination layers per unit height can be increased as compared with the lamination method according to the second embodiment using the pre-preg including a conductor pattern, thereby expecting a further higher-density wiring.

14th Embodiment

The 14th embodiment according to the present invention will now be described with reference to FIG. 22.

In this embodiment, a main difference from the 13th embodiment lies in that there is provided a laminated structure having both a build-up layer and a pre-preg layer including an electric conductor pattern.

Figure 22:
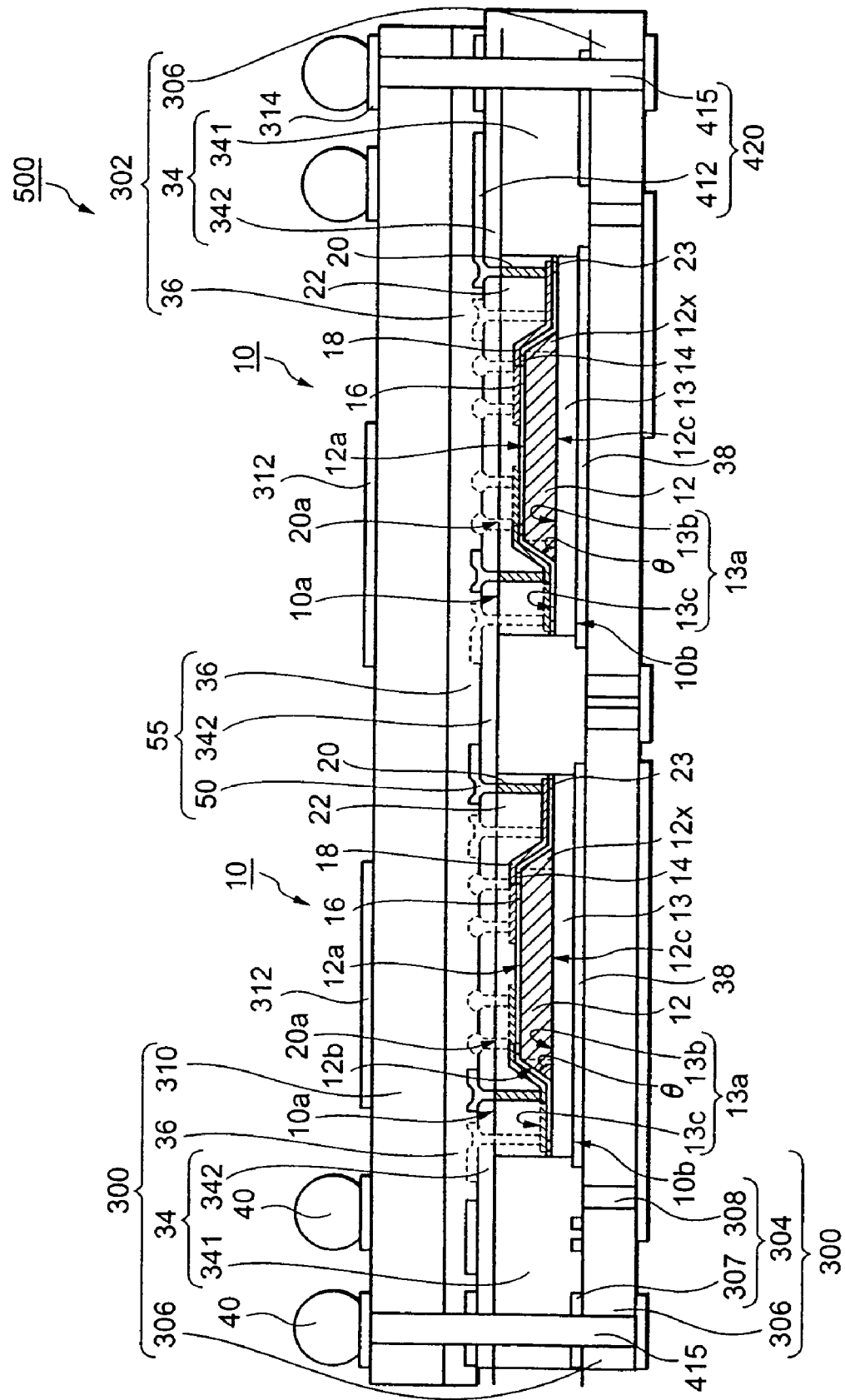
FIG. 22 is a schematic cross-sectional view illustrating a substrate having a built-in semiconductor apparatus according to a 14th embodiment of the present invention.

Specifically, as shown in FIG. 22, in this embodiment, a pre-preg hardened layer 310 which is one member in an insulating layer 330 is formed on a build-up layer 55, and a wiring 312 or a land 314 is formed by using a copper foil as an electric conductor on an outer surface of the pre-preg hardened layer 310. Furthermore, a first conductive wiring 412 which is formed from a post portion 20 onto a first insulating layer 34 and consists of copper, the wiring 312 and the land 314 are electrically connected with an electric conductor portion 415 as a second conductive wiring which pierces two sides of a substrate having a built-in semiconductor apparatus 500. That is, the electric conductor portion 415 is the second conductive wiring constituting an substrate wiring portion 420 in this embodiment. An external terminal 40 is formed on the land 314. That is, the substrate wiring portion 420 in this embodiment is configured to include the first conductive wiring 412 and the second conductive wiring 415.

Moreover, such a substrate having a built-in semiconductor apparatus 500 can be manufactured by laminating the pre-preg hardened layer 310 with a copper foil by, e.g., thermo compression bonding and then forming the electric conductor portion 415, the wiring 312 or the land 314 after the second insulating layer forming step and before the external terminal forming step described in connection with the first embodiment. It is to be noted that any other active element or passive element can be incorporated in the substrate having a built-in semiconductor apparatus 500 by the same method as that of the semiconductor apparatus As apparent from the above description, according to this embodiment, the same advantages as those of the 13th embodiment can be obtained.

Additionally, according to this embodiment, since the laminated structure can be formed by using the pre-preg hardened layer having the electric conductor pattern formed on the surface thereof, the high-density wiring can be inexpensively realized.

The present invention is not restricted to only a combination of the foregoing embodiments. Therefore, preferred conditions can be combined on an arbitrary preferred stage, and the present invention can be applied to such a combination.

For example, the semiconductor apparatus 10 is not restricted to only the above-described stack type MCP. That is, it is good enough to provide a structure that the redistribution wiring layer electrically connected with the first electrode pad includes the protruding portion which functions as an expansion portion capable of extending on an area other than the first semiconductor chip. Therefore, it is possible to select, e.g., (1) a structure including an expansion portion provided in contact with a surface opposed to the side end surface of the WCSP or the main surface of the chip or (2) a transversal MCP structure having an expansion portion formed thereto which is provided in contact with respective side end surfaces of a plurality of semiconductor chips aligned on substantially the same surface even in case of the MCP, in accordance with an object or a design. An example of the semiconductor apparatus 10 will now be described.

Figure 23A:
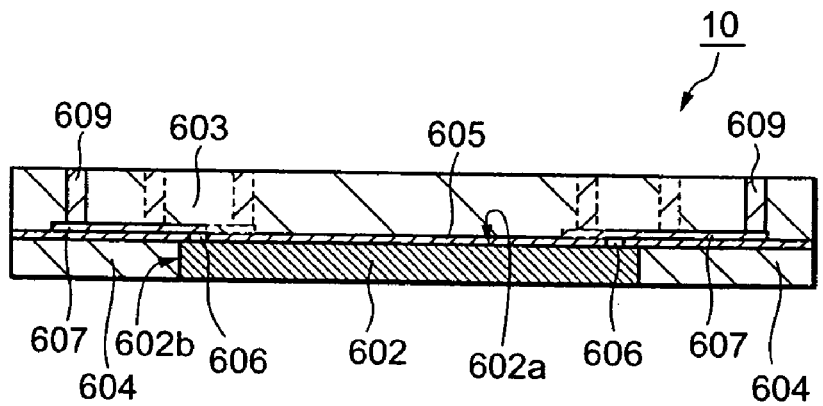
FIG. 23 are views (No. 1) illustrating a semiconductor apparatus according to the present invention.
Figure 23B:
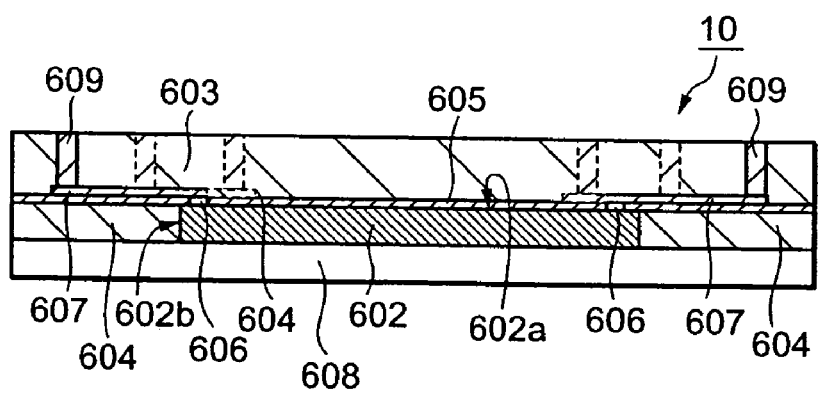
Figure 23C:
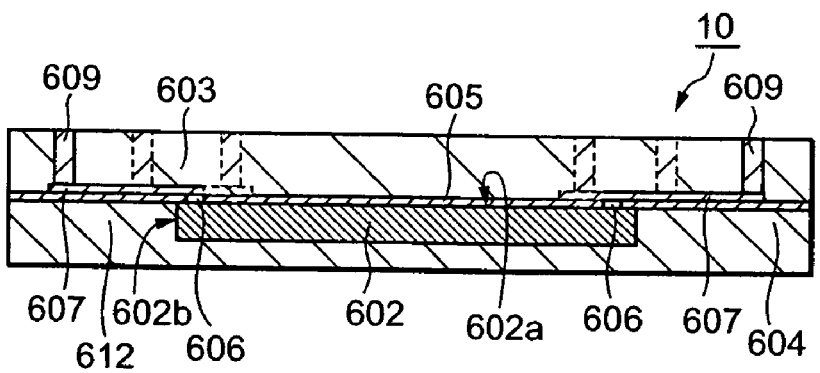
Figure 24A:
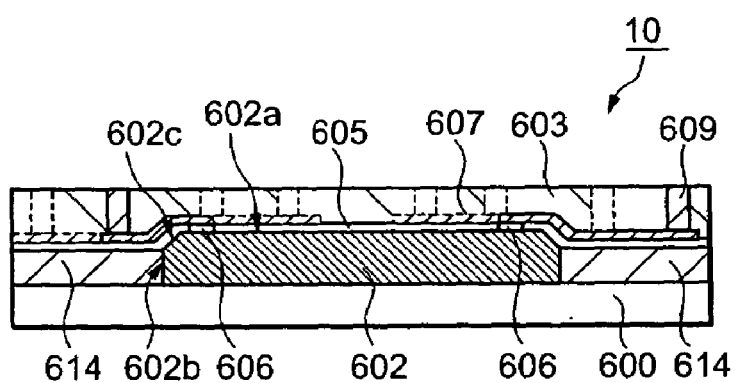
FIG. 24 are views (No. 2) illustrating a semiconductor apparatus according to the present invention.
Figure 24B:
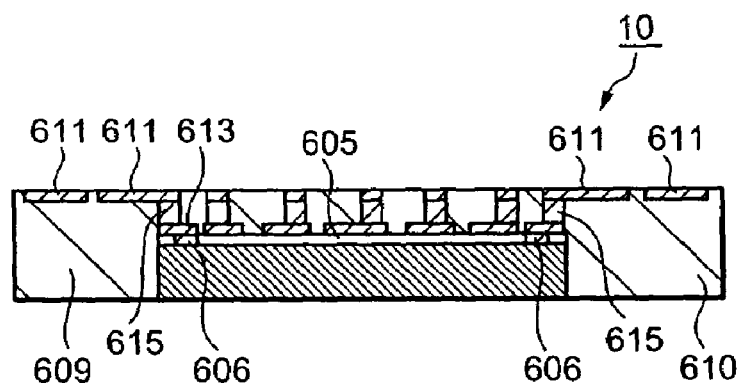
Figure 25:
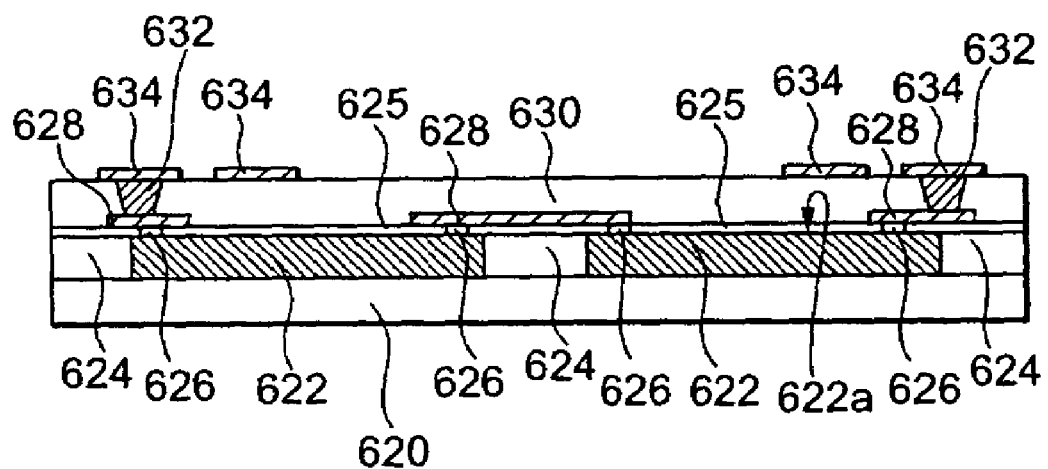
FIG. 25 is a view (No. 3) illustrating a semiconductor apparatus according to the present invention.

First, as (1), it is possible to arbitrarily preferably select structures (a) to (d). That is, (a) is a structure comprising a frame-like expansion portion 604 which is in contact with a side wall surface 602b of a semiconductor chip 602, one end of a redistribution wiring layer 607 having the other end connected to an electrode pad 606 exposed from an insulating film 605 on a main surface 602a of the semiconductor chip 602 being extended onto the expansion portion, and a post portion 609 whose top face is exposed from a sealing layer 603 being formed on the redistribution wiring layer 607 (FIG. 23A). (b) is a structure that (a) is further mounted on a support portion 608 (FIG. 23B). (c) is a structure that an expansion portion 612 in which the semiconductor chip 602 is embedded is provided so as to expose the main surface 602a of the semiconductor chip 602 in place of the expansion portion 604 described in connection with (a) (FIG. 23C). (d) is a structure which has an inclined side wall surface 602c obtained by chamfering a ridge portion between the side wall surface 602b and the main surface 602a of the semiconductor chip 602, a frame-like expansion portion 614 being provided so as to expose a part of a surface area of the inclined side wall surface 602c on the main surface 602a side (it is to be noted that a support portion 600 which supports the semiconductor chip 602 and the expansion portion 614 may be provided in accordance with an object or a design) (FIG. 24A). (e) is a structure that a second redistribution wiring layer 611 is formed in a surface area of a sealing layer 610 in which the semiconductor chip 602 is embedded by a transfer method and the second redistribution wiring layer 611 and an electrode pad 606 exposed from an insulating film 605 are electrically connected to each other through a first redistribution wiring layer 613 and a post portion 615 (FIG. 24B). Further, as (2), for example, a plurality of semiconductor chips 622 are aligned on the same surface at predetermined intervals on a support portion 620, an expansion portion 624 which is in contact with each side end surface of these semiconductor chips 622 is provided, and one end of a redistribution wiring layer 628 having the other end connected to an electrode pad 626 exposed from an insulating film 625 on a main surface 622a of the semiconductor chip 622 is extended onto the expansion portion 624. Furthermore, the redistribution wiring layer 628 is electrically connected with a land 634 on a sealing layer 630 which covers the semiconductor chips 622 and the expansion portions 624 through a via 632 formed on the redistribution wiring layer 628 (FIG. 25).

What is claimed is:

1. A method of manufacturing a substrate having a built-in semiconductor apparatus comprising:

(a) preparing a semiconductor apparatus which comprises a first semiconductor chip having a first electrode pad formed on a main surface thereof, a protruding portion which is in contact with the first semiconductor chip and protrudes from a side surface of the first semiconductor chip to the outside, a apparatus wiring portion which is provided so as to extend from the first electrode pad onto a surface of the protruding portion, a conductive portion which is in connected with the apparatus wiring portion and provided on the apparatus wiring portion, and a sealing portion which covers the main surface and the surface of the protruding portion so as to expose a top face of the conductive portion; and (b) forming an insulating layer in which the semiconductor apparatus is embedded, an external terminal formed on the insulating layer, and an substrate wiring portion which electrically connects the conductive portion with the external terminal.

2. The method according to claim 1, wherein the step (b) includes:

fixing the semiconductor apparatus on the base material;

forming a first insulating layer of the insulating layer on the base material and the semiconductor apparatus so as to expose a top face of the conductive portion of the semiconductor apparatus;

forming the substrate wiring portion which extends from the conductive portion onto the first insulating layer;

forming a second insulating layer of the insulating layer on the first insulating layer and the substrate wiring portion so as to expose a part of a surface of the substrate wiring portion; and forming the external terminal on the exposed substrate wiring portion.

3. The method according to claim 2, wherein a conductive wiring as the substrate wiring portion is formed on both surfaces and between the both surfaces of the base material.

4. The method according to claim 1, wherein the step (b) includes:

preparing a wiring substrate in which a plate-like portion as the insulating layer and a first conductive wiring as the substrate wiring portion formed on both surfaces and between the both surfaces of the plate-like portion are formed;

forming a composite substrate by connecting the first conductive wiring of the wiring substrate and an end surface of the conductive portion of the semiconductor substrate so as to face each other;

arranging a pair of resin formed plates each having a half-hardened insulative resin layer formed thereto on a metal plate in such a manner that the composite substrate is held from both sides thereof and each of the insulative resin layers and the composite substrate face each other;

thrusting the pair of resin formed plates from both sides thereof;

forming a hardened resin layer as the insulating layer by heating and hardening the thrusted insulative resin layers; and forming a second conductive wiring as the substrate wiring portion which electrically connects the metal plate and the first conductive wiring with each other.

5. The method according to claim 4, wherein an open hole is formed to the insulative resin layer of the resin formed plate on the semiconductor apparatus side so as to expose the metal plate at a part corresponding to the semiconductor apparatus in the resin formed plate arranging step.

6. The method according to claim 4, wherein a concave portion is formed to the insulative resin layer of the resin formed plate on the semiconductor apparatus side at a part corresponding to the semiconductor apparatus.

7. The method according to claim 6, wherein the concave portion forms an open hole to the second insulative resin layer formed on the plate-like first insulative resin layer so as to expose the first insulative resin layer at a part corresponding to the semiconductor apparatus.

8. The method according to any of claim 4, wherein a layer which has a predetermined thickness from the metal plate and contains fibers is formed as the insulative resin layer.

9. The method according to claim 8, wherein the fibers are glass fibers.

10. The method according to claim 4, a spacer having a predetermined thickness is formed on the wiring substrate in such a manner that a percentage of an area facing the resin formed plate and a percentage of an area not facing the resin formed plate in the wiring substrate become equal to each other in the resin formed plate arranging step.

* * * * *